United States Patent
Shimizu et al.

(10) Patent No.: US 9,076,532 B2
(45) Date of Patent: Jul. 7, 2015

(54) SEMICONDUCTOR MEMORY DEVICE AND METHOD OF TESTING THE SAME

(71) Applicant: KABUSHIKI KAISHA TOSHIBA, Minato-ku (JP)

(72) Inventors: Yuui Shimizu, Kawasaki (JP); Satoshi Inoue, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 130 days.

(21) Appl. No.: 14/021,057

(22) Filed: Sep. 9, 2013

(65) Prior Publication Data

US 2014/0269089 A1    Sep. 18, 2014

Related U.S. Application Data

(60) Provisional application No. 61/781,171, filed on Mar. 14, 2013.

(51) Int. Cl.
| | |
|---|---|
| G11C 16/04 | (2006.01) |
| G11C 16/06 | (2006.01) |
| G11C 5/06 | (2006.01) |
| G11C 16/10 | (2006.01) |

(52) U.S. Cl.
CPC .............. *G11C 16/06* (2013.01); *G11C 5/063* (2013.01); *G11C 16/10* (2013.01)

(58) Field of Classification Search
CPC ........ G11C 5/063; G11C 16/06; G11C 16/10; G11C 7/1051; G11C 8/08; G11C 8/10
USPC .............. 365/51, 63, 185.18, 185.21, 185.23, 365/189.02, 189.09, 230.06, 226
See application file for complete search history.

(56) References Cited

U.S. PATENT DOCUMENTS

| | | | | |
|---|---|---|---|---|
| 6,963,136 | B2 * | 11/2005 | Shinozaki et al. | 257/759 |
| 7,282,948 | B2 * | 10/2007 | Bales | 326/30 |
| 7,986,150 | B2 | 7/2011 | Yokou | |
| 2007/0217266 | A1 * | 9/2007 | Kim | 365/185.21 |
| 2007/0263459 | A1 * | 11/2007 | Kim et al. | 365/189.11 |
| 2011/0102073 | A1 | 5/2011 | Riho | |
| 2011/0109344 | A1 | 5/2011 | Choi et al. | |

FOREIGN PATENT DOCUMENTS

| | | |
|---|---|---|
| JP | 2008-135925 | 6/2008 |
| JP | 2011-101143 | 5/2011 |
| JP | 2011-103638 | 5/2011 |

\* cited by examiner

*Primary Examiner* — Gene Auduong
(74) *Attorney, Agent, or Firm* — Oblon, McClelland, Maier & Neustadt, L.L.P.

(57) ABSTRACT

A semiconductor memory device comprises a first-supplied-voltage-supplying pad, a second-supplied-voltage-supplying pad, a data input/output pad, a memory body, a buffer circuit and an impedance-controlling circuit. A first supplied voltage is supplied to the memory body. A second supplied voltage is supplied to the buffer circuit. The impedance-controlling circuit controls an impedance of the buffer circuit on a side connected to the data input/output pad. The semiconductor memory device comprises a voltage-generating circuit generating a first inner voltage. The impedance-controlling circuit comprises a first P-channel transistor. A source terminal of the first P-channel transistor is connected to the first-supplied-voltage-supplying pad, and the first inner voltage generated from the voltage-generating circuit is selectively supplied to a gate terminal of the first P-channel transistor.

22 Claims, 21 Drawing Sheets

SEMICONDUCTOR MEMORY DEVICE AND METHOD OF TESTING THE SAME

CROSS-REFERENCE TO RELATED APPLICATIONS

This application is based upon and claims the benefit of U.S. Provisional Patent Application No. 61/781,171, filed on Mar. 14, 2013, the entire contents of which are incorporated herein by reference.

FIELD

The embodiments described herein relate to a semiconductor memory device and a method of testing the same.

BACKGROUND

Description of the Related Art

Recently, in a field of semiconductor memory devices, for example, NAND Flash memories, operation speeds of interfaces which inputs data sent from controller chips to memory chips and outputs data sent from the memory chips to the controller chips are more fastened. Furthermore, output resistances (Ron) of output buffers vary between systems in optimum values. Therefore, the output buffers are configured to have functions controlling the output resistances and are used with controlled output resistances according to environments. Additionally, according to the fastening of the operation speeds of the interfaces, amplitudes of signals between the semiconductor chips are decreased and a problem based on reflections of signals is occurred by impedance mismatching at the end of the interfaces. In semiconductor chips which need such fast-operating interfaces, impedance matching circuits called "On Die Termination (ODT)" are equipped near pads in the semiconductor chips.

DETAILED DESCRIPTION

A semiconductor memory device according to embodiments described below comprises a first pad, a second pad, a third pad, a memory body, a buffer circuit and an impedance-controlling circuit. A first voltage is supplied to the first pad. A second supplied voltage is supplied to the second pad. The first supplied voltage is supplied to the memory body. The memory body memorizes data. The buffer circuit is connected to the memory body and the third pad. The second supplied voltage is supplied to the buffer circuit. The impedance-controlling circuit controls an impedance of the buffer circuit on a side connected to the third pad. A first voltage is supplied to the semiconductor memory device as the first supplied voltage. One of the first voltage and a second voltage smaller than the first voltage is supplied to the semiconductor memory device as the second supplied voltage. The semiconductor memory device comprises a voltage-generating circuit generating a first inner voltage from the first supplied voltage supplied via the first pad. As a replica element of certain transistors connected to the third pad, the impedance-controlling circuit comprises a first P-channel transistor at a final stage. A source terminal of the first P-channel transistor is connected to the first pad, and the first inner voltage generated from the voltage-generating circuit is selectively supplied to a gate terminal of the first P-channel transistor. Hereinafter, a semiconductor memory device and a testing method of the semiconductor memory device according to embodiments are described with reference to the accompanying drawings.

First Embodiment

[Configuration]

[Configuration when the Semiconductor Memory Device is Used]

Figure 1:
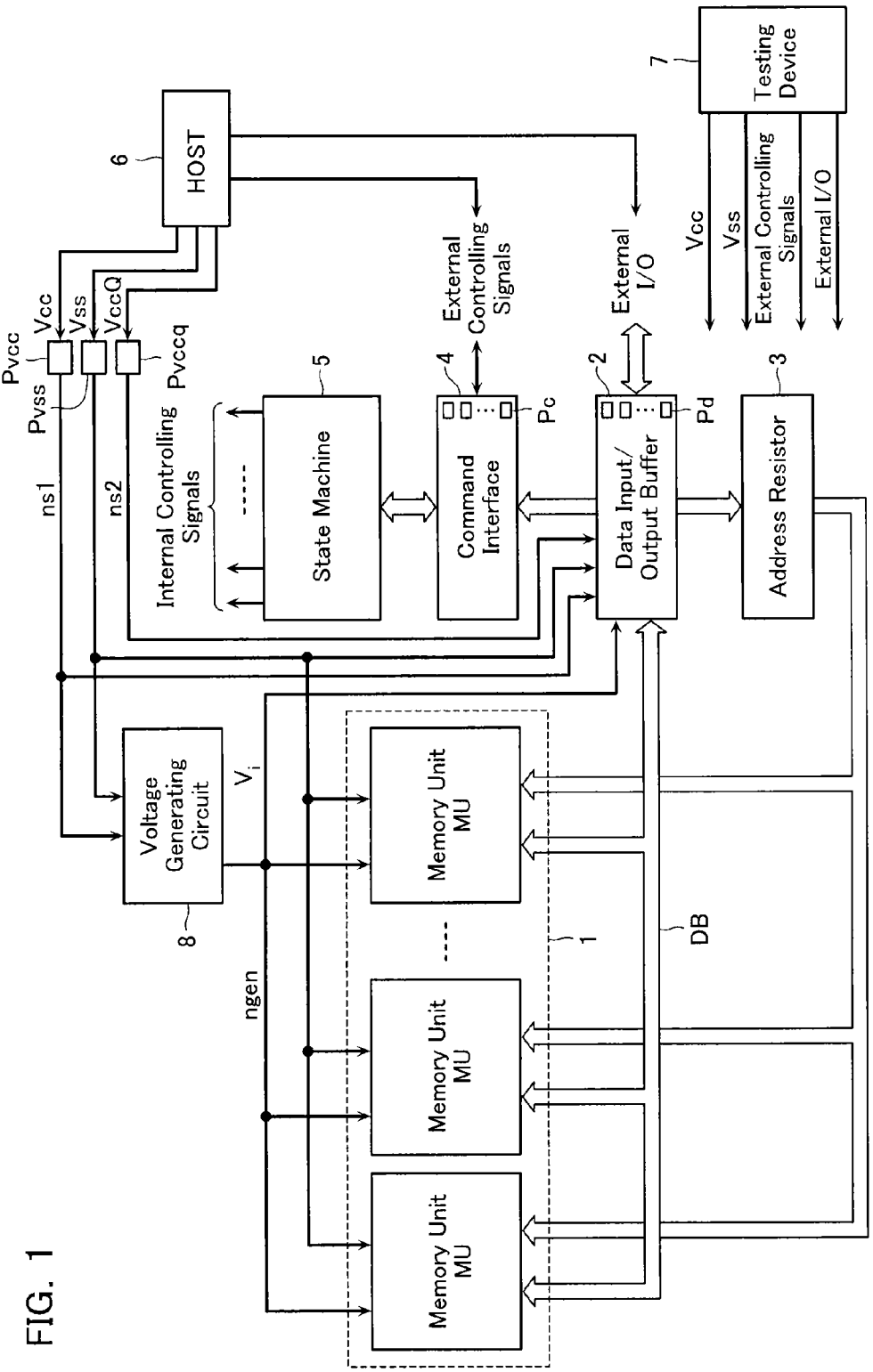
FIG. 1 is a block diagram showing a configuration of a semiconductor memory device according to a first embodiment.

FIG. 1 is a block diagram showing a configuration of a semiconductor memory device according to a first embodiment. The semiconductor memory device comprises a memory body 1 having a plurality of memory units MU connected to a data bus DB in parallel. The memory units MU are configured by NAND-type flash memories, NOR-type flash memories, ReRAM or the like.

A data input/output buffer 2 is connected to external host 6 via data pads Pd inputting data and outputting data. The data input/output buffer 2 receives writing data, receives erasing commands, outputs read data and receives address data and command data. The data input/output buffer 2 sends the writing data received from host 6 to the memory body 1 and outputs the read data read from the memory body 1 to the host 6. The address data supplied to the data input/output buffer 2 from the external host 6 is sent to the memory body 1 via an address resistor 3.

The commands supplied to the data input/output buffer 2 from the host 6 are sent to a command interface 4. The command interface 4 receives external controlling signal via command pads Pc, verifies whether the received data is the writing data, the command data or the address data, and if the input data is the command data, receives the input data and sends the input data to a state machine 5.

The state machine 5 entirely manages the semiconductor memory device, receives commands sent from the host 6 via command interface 4, and performs reading operation, writing operation, erasing operation, management of data input/output and so on.

The external host 6 may receive status information managed by the state machine 5 and may verifies results of the operations. This status information can also be used to control the writing operation and the erasing operation.

According to Toggle and ONFi (Open NAND Flash interface), the semiconductor memory device uses a first supplied voltage Vcc which is a power source of the entire configurations of the semiconductor memory device except the data input/output buffer 2 and a second supplied voltage VccQ which is a power source of the data input/output buffer 2. A voltage value of the first supplied voltage Vcc is set to, for example, 2.7 V to 3.6 V. A voltage value of the second supplied voltage VccQ is set to, for example, 2.7 V to 3.6 V or 1.7 V to 1.95 V. The semiconductor memory device is configured so that amplitude of voltages in the input/output buffer 2 is controlled by the host 6. That is, the second supplied voltage VccQ is decided based on a parameter (F=OUTTRIM= VQ18) set by the host 6. Additionally, from the host 6, for example, 3.3 V (a first voltage V1) is supplied to a first-supplied-voltage-supplying pad Pvcc, for example, 3.3 V (the first voltage V1) or 1.8 V (a second voltage V2) is supplied to a second-supplied-voltage-supplying pad Pvccq and 0 V is supplied to the ground-voltage-supplying pad Pvss.

Hereinafter, a node electrically connected between the first-supplied-voltage-supplying pad Pvcc and each composing elements is referred as a first-supplied-voltage-supplying node ns1 and a node electrically connected between the second-supplied-voltage-supplying pad Pvccq and each composing elements is referred as a second-supplied-voltage-supplying node ns2. Furthermore, nodes connected to the data input/output pad Pd is referred as data input/output nodes nio.

[Configuration when the Semiconductor Memory Device is Tested]

A voltage-generating circuit 8 generates the first voltage V1 (3.3 V) or the second voltage V2 (1.8 V) as inner voltage $V_i$ from the first supplied voltage Vcc supplied to the first-supplied-voltage-supplying node ns1. Additionally, the voltage-generating circuit 8 supplies the inner voltage $V_i$ to the data input/output buffer 2 via an inner-voltage-supplying node ngen.

When a testing operation is performed, the semiconductor memory device is connected to a testing device 7 instead of the external host 6. The testing device 7 supplies the first supplied voltage Vcc, the ground voltage Vss and external controlling signals to the semiconductor memory device. However, when the testing operation is performed, the second supplied voltage VccQ is not supplied to the semiconductor memory device. Therefore, only one supplied voltage is supplied to the semiconductor memory device at the same timing in the testing operation. Thus, the testing operation of one semiconductor memory device can be performed using only one probe. Hence, comparing to a case that the testing device 7 supplies not only the first supplied voltage Vcc but also the second supplied voltage VccQ to the semiconductor memory device, a number of the semiconductor memory devices which can be tested at the same time is doubled. Accordingly, the total cost of the testing operation can be significantly suppressed.

Furthermore, the testing device 7 supplies a test voltage to the data input/output pad Pd and measures a current flowing through the data input/output pad Pd. Subsequently, the testing device 7 converts the measured current to the digital data, and supplies the digital data to the data input/output buffer 2 via the data input/output pad Pd.

[The Data Input/Output Buffer 2]

A configuration of the data input/output buffer 2 of the semiconductor memory device according to the embodiment is described. When data is output from an off chip driver (OCD) of the data input/output buffer 2, an output resistance of the data input/output buffer 2 (Ron) fluctuates due to environments in which the semiconductor memory device is used. If an output-impedance of the data input/output buffer 2 does not match an impedance of an external circuit, errors can be occurred. This kind of problems can be suppressed by controlling (trimming) the output resistance of the OCD in a test sequence.

Figure 2:
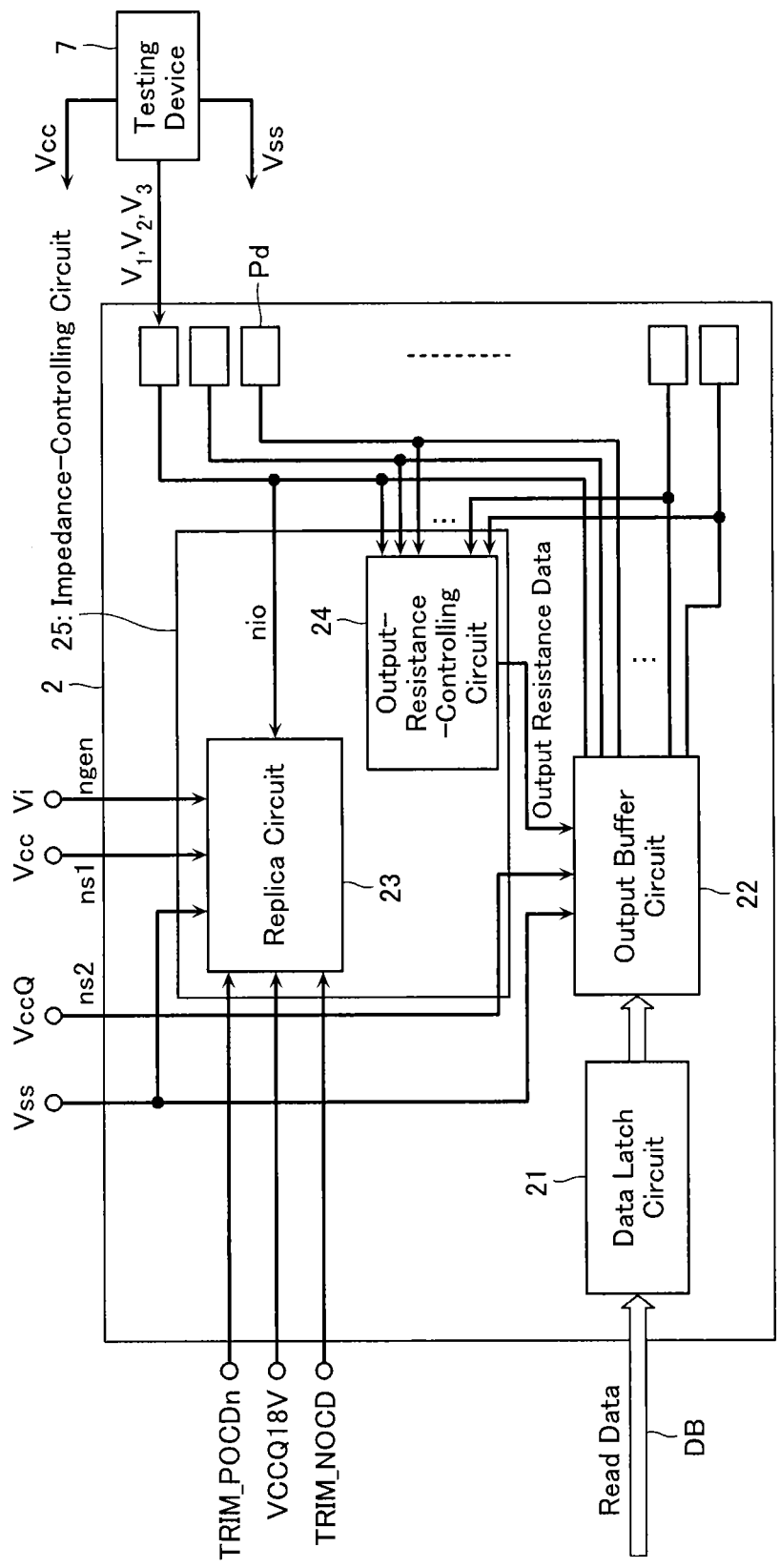
FIG. 2 is a block diagram showing a configuration of a data input/output buffer 2 of the same semiconductor memory device.

FIG. 2 is a block diagram showing a configuration of a part of the data input/output buffer 2 according to the embodiment. Note that the data input/output buffer 2 is connected to the testing device 7 in FIG. 2 for explanations. The data input/output buffer 2 according to the embodiment comprises a data latch circuit 21 latching read data read from the memory body 1 and an output buffer circuit 22 outputting the read data latched by the data latch circuit 21 to external via the data input/output pad Pd. The data input/output buffer 2 further comprises an impedance-controlling circuit 25 controlling the output impedance (the output resistance Ron) of the output buffer circuit 22. The impedance-controlling circuit 25 comprises a replica circuit 23 including replica elements of the transistors in the final stage of the output buffer circuit 22. When the testing operation is performed, the first supplied voltage Vcc is supplied from the testing device 7 to the first-supplied-voltage-supplying pad Pvcc, the ground voltage Vss is supplied from the testing device 7 to the ground-voltage-supplying pad Pvss, and a first test voltage $V_1$, a second test voltage $V_2$ or a third test voltage $V_3$ is supplied from the testing device 7 to the data input/output pad Pd. Furthermore, the data input/output buffer 2 comprises an output-resistancecontrolling circuit 24. The output-resistance-controlling circuit 24 inputs a current data measured and A/D converted by the testing device 7. Additionally, the output-resistance-controlling circuit 24 generates an output resistance data based on the input current data. For example, the output-resistance-controlling circuit 24 compares the input current data to tables. The output-resistance-controlling circuit 24 outputs the output resistance data to the output buffer circuit 22.

[The Replica Circuit 23]

A circuit configuration of the replica circuit 23 according to the embodiment is described with reference to FIG. 3. The replica circuit 23 according to the embodiment comprises: a replica transistor circuit REP including a first P-channel transistor P1 and a first N-channel transistor N1 serially connected to the first P-channel transistor P1; a P gate voltage controlling circuit PCG controlling a gate voltage of the first P-channel transistor P1; and an N gate voltage controlling circuit NGC controlling a gate voltage of the first N-channel transistor N1.

The first P-channel transistor P1 and the first N-channel transistor N1 in the replica transistor circuit REP are replica elements of transistors in final stage of the output buffer circuit 22. A source terminal of the first P-channel transistor is connected to the first-supplied-voltage-supplying node ns1. Furthermore, a drain terminal of the first P-channel transistor is connected to the data input/output pad Pd via the data input/output node nio. Similarly, a source terminal of the first N-channel transistor is connected to the data input/output pad Pd via the data input/output node nio. Furthermore, a drain terminal of the first N-channel transistor is connected to a ground terminal connected to the ground-voltage-supplying pad Vss, and the ground voltage Vss is supplied to the drain terminal of the first N-channel transistor.

The P gate voltage controlling circuit PCG inputs an inner controlling signal TRIM_POCDn and an inner controlling signal VCCQ18V from the state machine 5. The inner controlling signal TRIM_POCDn is basically set to "L" state and is set to "H" state when a trimming operation of the P-channel transistor P1 is performed. The inner controlling signal VCCQ18V is set to "L" state when the trimming operations are performed using the first voltage V1 (3.3 V) as the second supplied voltage VccQ and is set to "H" state when the trimming operations are performed using the second voltage V2 (1.8 V) as the second supplied voltage VccQ.

The P gate voltage controlling circuit PGC comprises: a level-shift circuit LS1 shifting an amplitude level of the inner controlling signal TRIM_POCDn from an inner supplied voltage VDD to the inner voltage $V_i$; an inverter I1 inverting an output signal of the level-shift circuit LS1; another inverter I2 inverting an output signal of the inverter I1; a level-shift circuit LS3 shifting an amplitude level of the output signal of the inverter I2 from the inner voltage $V_i$ to the first supplied voltage Vcc; a NAND gate G1 inputting the output signal of the level-shift circuit LS1 and the inner controlling signal VCCQ18V; and a NOR gate G2 inputting the output signal of the inverter I1 and the inner controlling signal VCCQ18V. An output signal of the level-shift circuit LS3 is input to the gate terminal of a second P-channel transistor P2. The second P-channel transistor P2 has source terminal and back gate terminal connected to the first-supplied-voltage-supplying node ns1 and has a drain terminal connected to the gate terminal of the first P-channel transistor P1. An output signal of the NAND gate G1 is input to the gate terminal of a third P-channel transistor P3. The third P-channel transistor P3 has a source terminal connected to the inner-voltage-supplying node ngen, has a back gate terminal connected to the first-supplied-voltage-supplying node ns1 and has a drain terminal connected to the gate terminal of the first P-channel transistor P1. An output signal of the NOR gate G2 is input to a gate terminal of a second N-channel transistor N2. The second N-channel transistor N2 has a drain terminal connected to the gate terminal of the first P-channel transistor P1 and has a source terminal connected to the ground terminal Vss. In the P gate voltage controlling circuit PGC, a part corresponds to an inverter element composed from the third P-channel transistor P3 and the second N-channel transistor N2 is driven by the inner voltage $V_i$ and the other elements are driven by the first supplied voltage Vcc.

On the other hand, the N gate voltage controlling circuit NGC inputs an inner controlling signal TRIM_NOCD from the state machine 5. The inner controlling signal TRIM_NOCD is basically set to "L"-state and is set to "H"-state when a trimming operation of the first N-channel transistor is performed. The N gate voltage controlling circuit NGC comprises: a level-shifting circuit LS2 shifting an amplitude level of the inner controlling signal TRIM_NOCD from the level of the inner supplied voltage VDD to the inner voltage $V_i$; an inverter I3 inverting an output signal of the level-shifting circuit LS2; and another inverter I4 inverting an output signal of the inverter I3. The inverters I3 and I4 are driven by the inner voltage V1. The output signal of the inverter I4 is input to the gate terminal of the first N-channel transistor N1.

[The Output Buffer Circuit 22]

Figure 4:
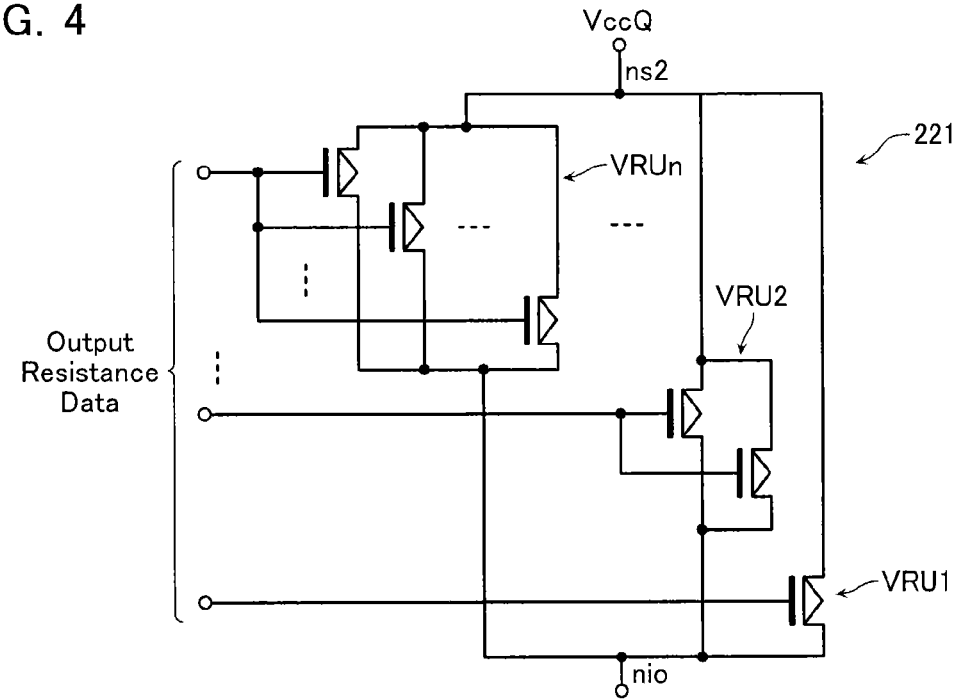
FIG. 4 is a circuit diagram showing a configuration of a pull-up circuit 221 of the same data input/output buffer 2.

The output buffer circuit 22 comprises a pull-up circuit 221 and a pull-down circuit 222 controlling the output resistance of the output buffer circuit 22 (Ron). FIG. 4 is a circuit diagram showing a schematic structure of the pull-up circuit 221. The pull-up circuit 221 comprises a plurality of variable-resistance units VRU1 to VRUn connected in parallel to the second-supplied-voltage-supplying node ns2 and the data input/output node nio. A variable-resistance unit VRUk ("k" is an integer number from 1 to n) is composed from $2^{k-1}$ pull-up transistors connected in parallel. The $2^{k-1}$ pull-up transistors respectively have drain terminals connected to the data input/output node nio and have source terminals connected to the second-supplied-voltage-supplying node ns2. The output resistance data output from the testing device 7 is n-bits binary data, and a k-ordered bit of the output resistance data is commonly input to gate terminals of the $2^{k-1}$ pull-up transistors composing the k-ordered variable-resistance unit VRUk. Additionally, channel width, channel length and so on of the pull-up transistors included by the pull-up circuit 221 is set to be the same as each other. Therefore, the pull-up circuit 221 is able to set a value of a pull-up resistance between the second-supplied-voltage-supplying node ns2 and the data input/output node nio to a certain resistance value selected from $2^n$ resistance values according to the output resistance data.

Figure 5:
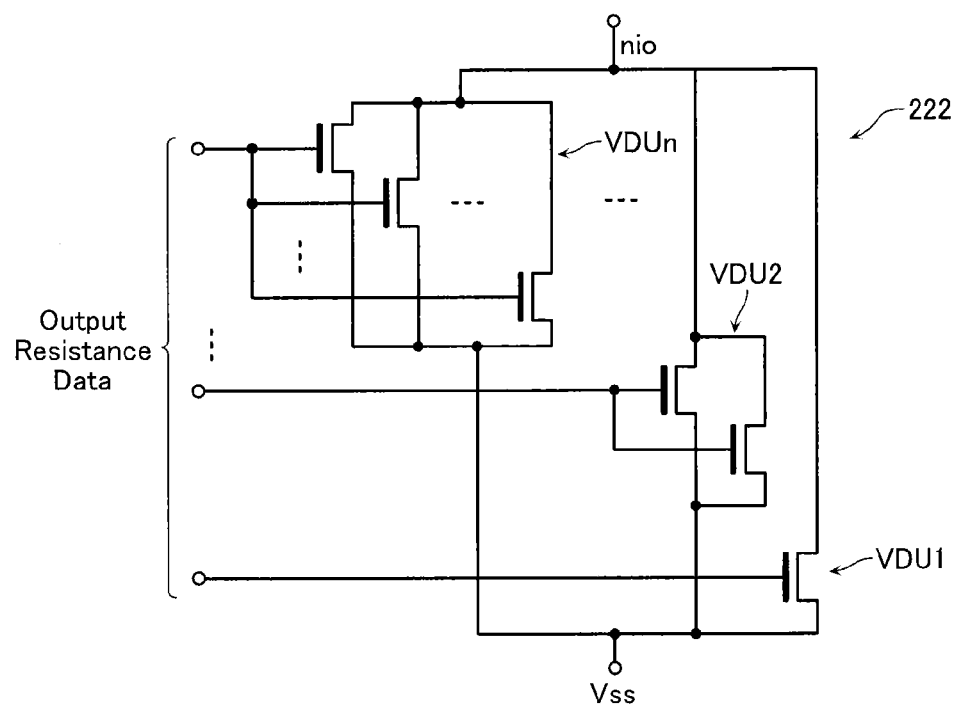
FIG. 5 is a circuit diagram showing a configuration of a pull-down circuit 222 of the same data input/output buffer 2.

FIG. 5 is a circuit diagram showing a schematic structure of the pull-down circuit 222. Similarly to the pull-up circuit 221, the pull-down circuit 222 is able to control a resistance value between the data input/output node nio and the ground terminal Vss by controlling conductive states of a plurality of transistors. The pull-down circuit 222 comprises a plurality of variable-resistance unit VDU1 to VDUn connected in parallel to the data input/output node nio and the ground terminal Vss. A variable-resistance unit VDUk ("k" is a integer number from 1 to n) is composed from $2^{k-1}$ pull-down transistors connected in parallel. The $2^{k-1}$ pull-down transistors respectively have drain terminals connected to the data input/output node nio, have source terminals connected to the ground terminal Vss and have gate terminals to which k-ordered data of the output resistance data is commonly input. Additionally, channel width, channel length and so on of the pull-down transistors included by the pull-down circuit 222 is set to be the same as each other. Therefore, the pull-down circuit 222 is able to set a pull-down resistance between the data input/output node nio and the ground terminal Vss to a certain resistance value selected from $2^n$ resistance values according to the output resistance data.

[Trimming Method]

[Trimming Operation of N-Channel Transistor]

Figure 6:
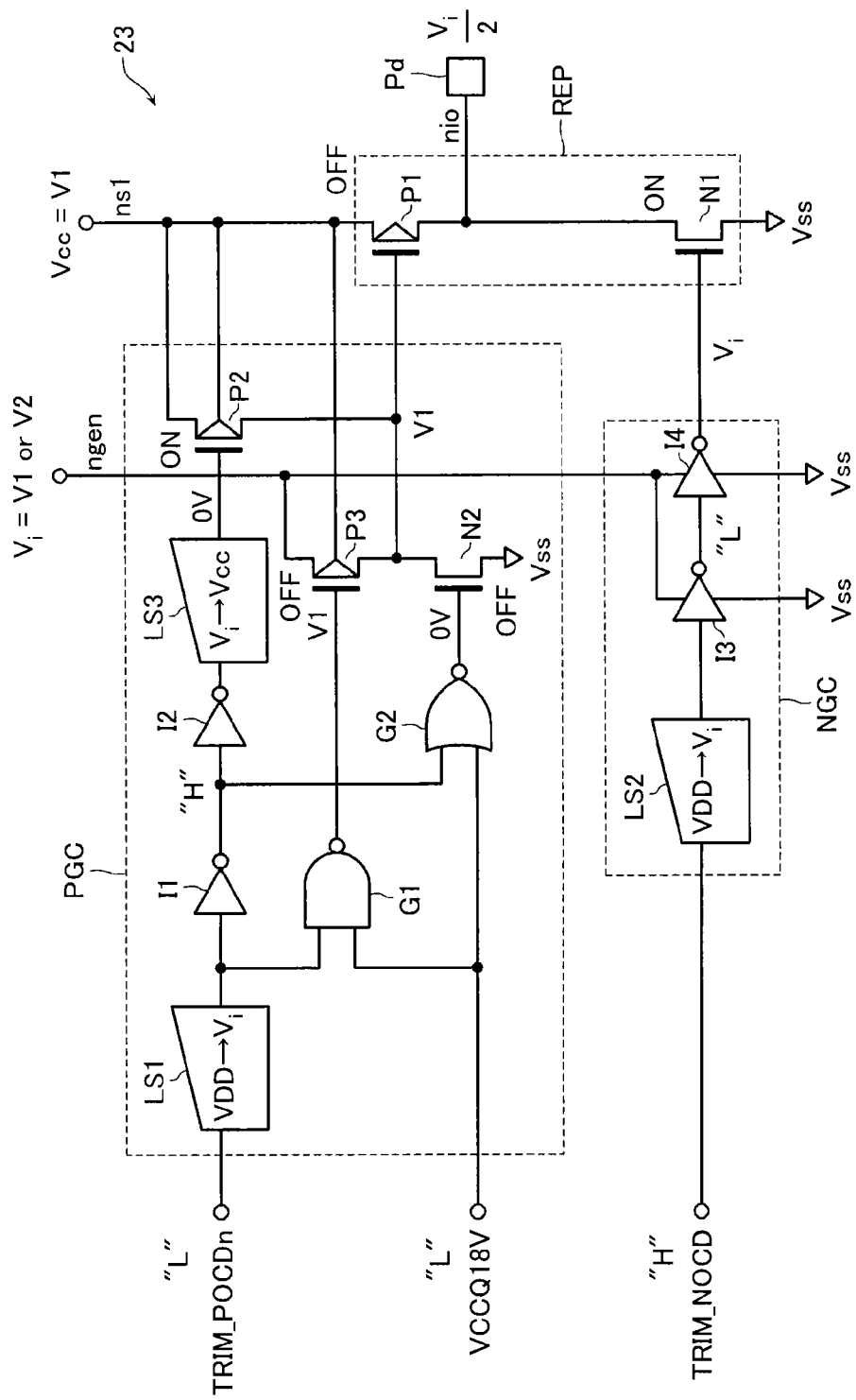
FIG. 6 is a circuit diagram for explaining a trimming method according to the same embodiment.

FIG. 6 is a figure showing voltage states of each parts of the replica circuit 23 when a trimming operation of the pull-down transistors is performed. When the trimming operation of the pull-down transistors is performed, the testing device 7 respectively supplies the first voltage V1 (3.3 V) to the first-supplied-voltage-supplying pad Pvcc, a half voltage of the inner voltage $V_i/2$ (1.65 V or 0.9 V) to the data input/output pad Pd and 0 V to the ground-voltage supplying pad Pvss. Additionally, the testing device sets the inner-controlling signal TRIM_NOCD to the "H" state, the inner-controlling signal TRIM_POCDn to the "L" state and the inner-controlling signal VCCQ18V to the "L" state. Then, because the output signal of the level-shifting circuit LS3 is set to 0 V, the second P-channel transistor P2 is set to "ON" state. As a result, the first voltage V1 is supplied to the gate terminal of the first P-channel transistor P1 and the first P-channel transistor P1 is set to "OFF" state. On the other hand, because the output signal of the inverter I4 is set to the inner voltage $V_i$, the first N-channel transistor is set to "ON" state. Additionally, a half voltage of the inner voltage $V_i$ is supplied between the drain terminal and the source terminal of the first N-channel transistor N1. Therefore, a certain current which flows if the half voltage of the inner voltage $V_i$ is supplied between the drain terminal and the source terminal flows. The certain current is measured by the testing device 7. In the trimming operation of the pull-down transistors, the inner voltage $V_i$ is set to one of the first voltage V1 and the second voltage V2, selectively.

Focusing on the third P-channel transistor P3, when the inner voltage $V_i$ is set to the second voltage V2 smaller than the first voltage V1, the source voltage of the third P-channel transistor P3 is set to the second voltage V2 and the drain voltage of the third P-channel transistor P3 is set to the first voltage V1. Therefore, if the substrate terminal of the third P-channel transistor P3 is connected to the source terminal of the third P-channel transistor P3, a voltage is forwardly supplied to a junction formed between $P^+$-dif fused N-well set to the first voltage V1 and the drain terminal set to the second voltage V2, and current flows. To prevent the current from flowing, the substrate terminal of the third P-channel transistor is connected to the first-supplied-voltage-supplying node ns1.

[Trimming Operation of P-Channel Transistor (VccQ=V1)]

Figure 7:
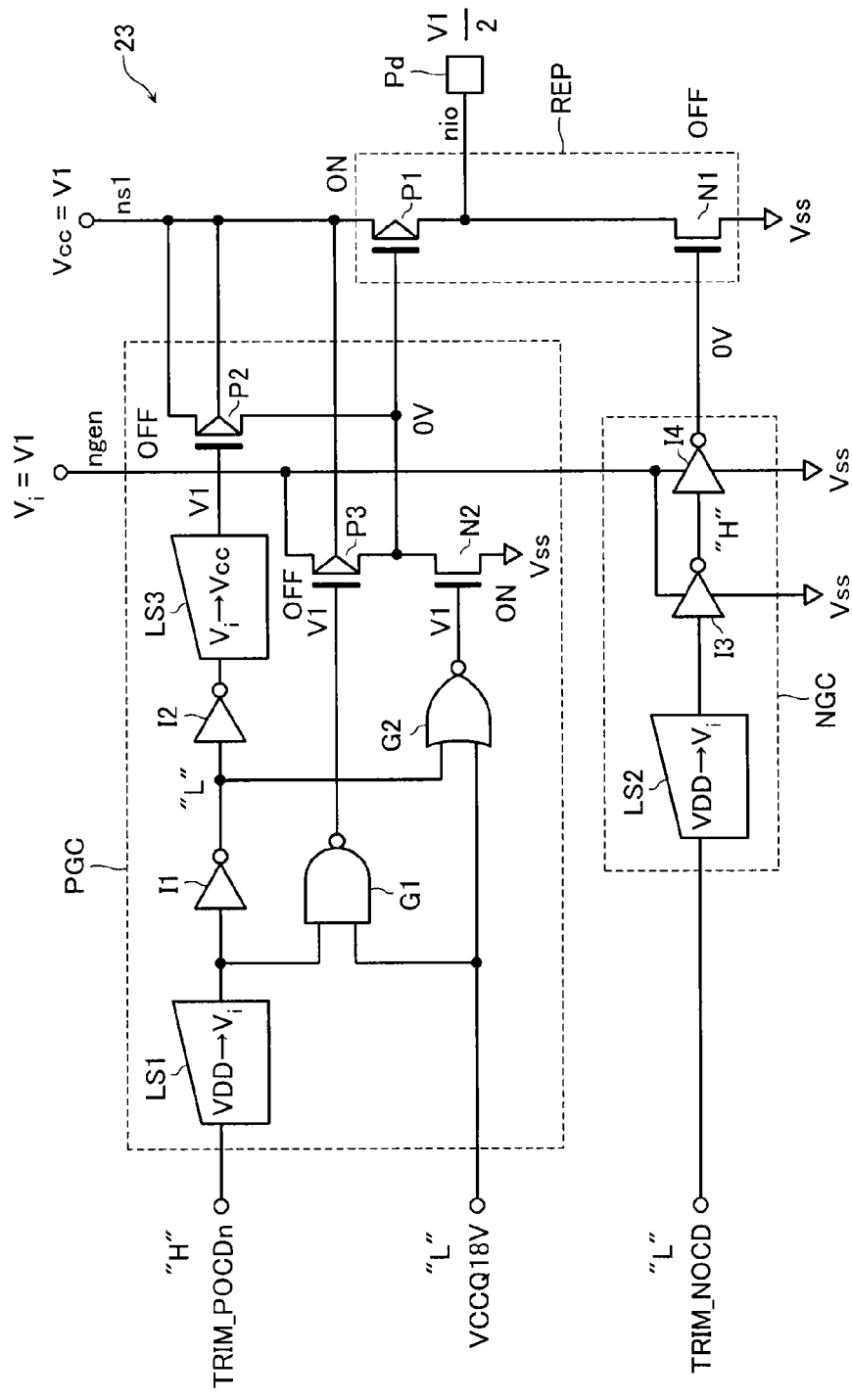
FIG. 7 is a circuit diagram for explaining the trimming method according to the same embodiment.

FIG. 7 is a figure showing voltage states of each parts of the replica circuit 23 when a trimming operation of the pull-up transistors is performed using the first voltage V1 as the second supplied voltage VccQ. When the trimming operation of the pull-up transistors is performed, the testing device 7 respectively supplies the first voltage V1 (3.3 V) to the first-supplied-voltage-supplying pad Pvcc, a half voltage of the first voltage V1/2 (1.65 V) to the data input/output pad Pd and 0 V to the ground-voltage supplying pad. Additionally, the testing device 7 sets the inner-controlling signal TRIM_NOCD to the "L" state, the inner-controlling signal TRIM_POCDn to the "H" state and the inner-controlling signal VCCQ18V to the "L" state. Then the first N-channel transistor N1 is set to "OFF" state as the output signal of the inverter I4 is set to 0 V. On the other hand, as the first voltage V1 is supplied to the gate terminals of the second P-channel transistor P2, the third P-channel transistor P3 and the second N-channel transistor N2, the second P-channel transistor P2 and the third P-channel transistor P3 are set to "OFF" state and the second N-channel transistor N2 is set to "ON" state. Therefore, 0 V is supplied to the gate terminal of the first P-channel transistor P1, the first P-channel transistor is set to "ON" state. Furthermore, a half voltage of the first voltage V1/2 is supplied to the data input/output pad Pd from the testing device 7. Thus, a certain current which flows if the half voltage of the first voltage V1 is supplied between the drain terminal and the source terminal flows between the drain terminal and the source terminal of the first P-channel transistor P1. The certain current is measured by the testing device 7.

[Trimming Operation of P-Channel Transistor (VccQ=V2)]

Figure 8:
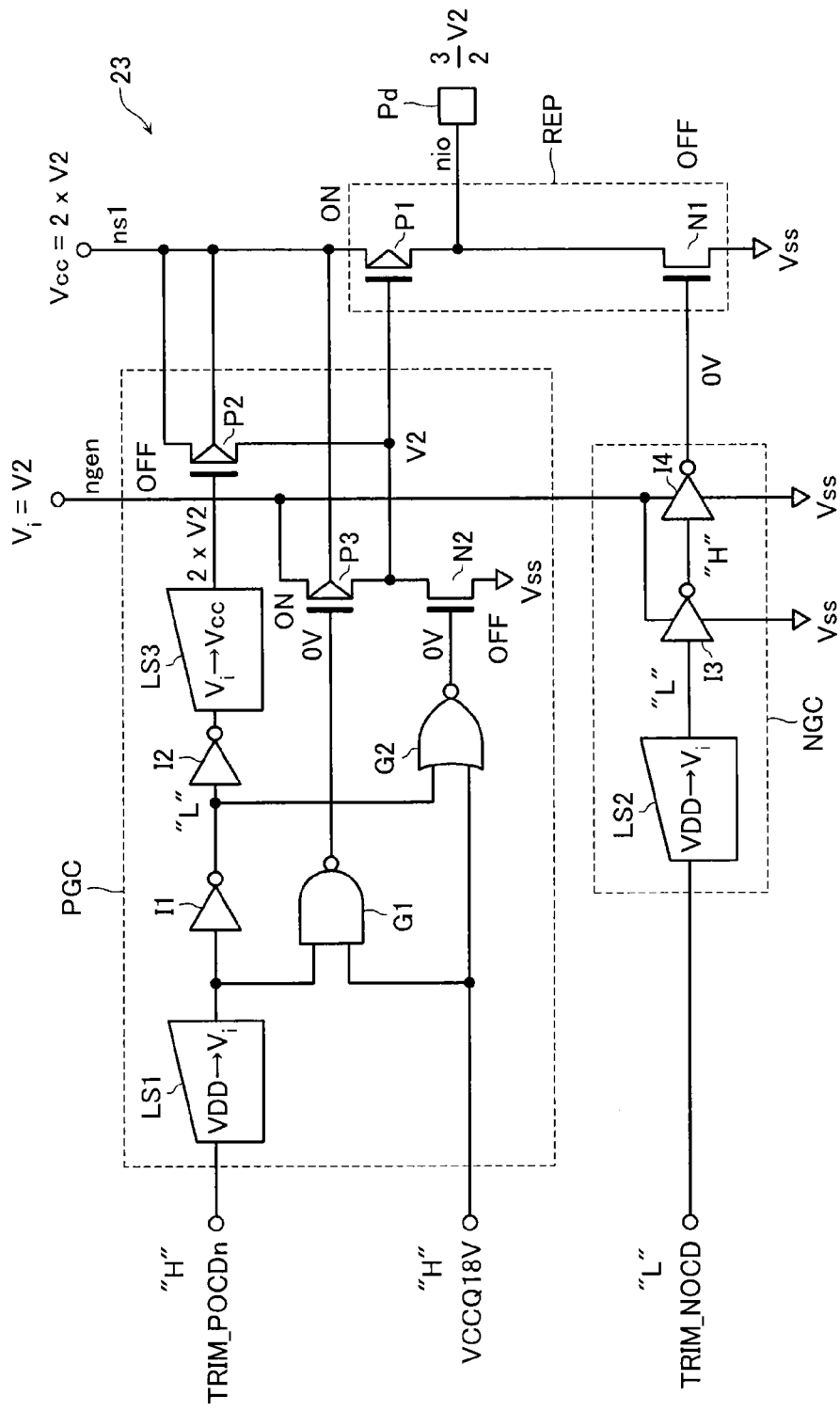
FIG. 8 is a circuit diagram for explaining the trimming method according to the same embodiment.

FIG. 8 is a figure showing voltage states of each parts of the replica circuit 23 when a trimming operation of the pull-up transistors is performed using the second voltage V2 as (the second supplied voltage) VccQ. When the trimming operation of the pull-up transistors is performed, the testing device 7 respectively supplies a twice voltage of the second voltage 2V2 (3.6 V) to the first-supplied-voltage-supplying pad Pvcc, three half voltages of the second voltage (3/2) V2 (2.7 V) to the data input/output pad Pd and 0 V to the ground-voltage supplying pad. Additionally, the testing device 7 sets the inner-controlling signal TRIM_NOCD to the "L" state, the inner-controlling signal TRIM_POCDn to the "H" state and the inner-controlling signal VCCQ18V to the "H" state. The first supplied voltage Vcc is set to 2V2 because the second voltage V2 (1.8 V) is not in the appropriate voltage range of the first supplied voltage Vcc (2.7 V to 3.6 V) and errors can occurred because of this. In accordance with the increase of the first supplied voltage, the drain voltage is increased to the three half of the second voltages (3/2) V2 (2.7 V) so that the source-drain voltage of the first P-channel transistor P1 is maintained to a half voltage of the second voltage V2/2 (0.9 V).

Then, same as the above, the first N-channel transistor N1 is set to "OFF" state as the output signal of the inverter I4 is set to 0 V. On the other hand, because the twice voltage of the second voltage 2V2 is supplied to the gate terminal of the second P-channel transistor P2 and 0 V is supplied to the gate terminals of the third P-channel transistor P3 and the second N-channel transistor N2, the second P-channel transistor P2 and the second N-channel transistor N2 are set to "OFF" state and the third P-channel transistor P3 is set to "ON" state. Therefore, the second voltage V2 is supplied to the gate terminal of the first P-channel transistor P1, the first P-channel transistor is set to "ON" state. Furthermore, the three half of the second voltage (3/2)V2 is supplied to the data input/output pad Pd from the testing device 7. Accordingly, a certain current which flows if the half voltage of the second voltage V2/2 is supplied between the drain terminal and the source terminal flows between the drain terminal and the source terminal of the first P-channel transistor P1. The certain current is measured by the testing device 7.

[Effects of the Trimming Method According to the Embodiment]

In the trimming method according to the embodiment, the testing device 7 supplies only the first supplied voltage Vcc and the second supplied voltage VccQ is generated in the semiconductor memory device. Hence, a number of terminals needed for the testing operation can be reduced. However, comparing to a case that the second supplied voltage VccQ is generated in the semiconductor memory device to another case that the second supplied voltage VccQ is generated in the testing device 7, it is more difficult to supply sufficient current in the former case. Therefore, if the second voltage V2 generated in the semiconductor memory device is directly supplied to the source terminal of the first P-channel transistor P1 as the second supplied voltage VccQ, the source voltage of the first P-channel transistor P1 can be dropped and this makes it difficult to measure an accurate value of current.

In the semiconductor memory device according to the embodiment, even if the second voltage V2 is used as the second supplied voltage VccQ, the twice voltage of the second voltage 2V2 is supplied from the testing device 7 as the source voltage of the first P-channel transistor P1 and the inner voltage $V_i$ generated in the semiconductor memory device is supplied only to the gate terminal of the first P-channel transistor P1. Accordingly, a sufficient current is supplied to the first P-channel transistor P1 and the current-measuring is performed appropriately.

Second Embodiment

Next, a semiconductor memory device according to the second embodiment is described. In the first embodiment, the output impedance of the data input/output buffer 2 is controlled. In the second embodiment, a semiconductor memory device comprises a data input/output buffer 2' having an On Die Termination (ODT) function which controls a terminating resistance of the input terminals of the data input/output buffer 2'.

Figure 9:
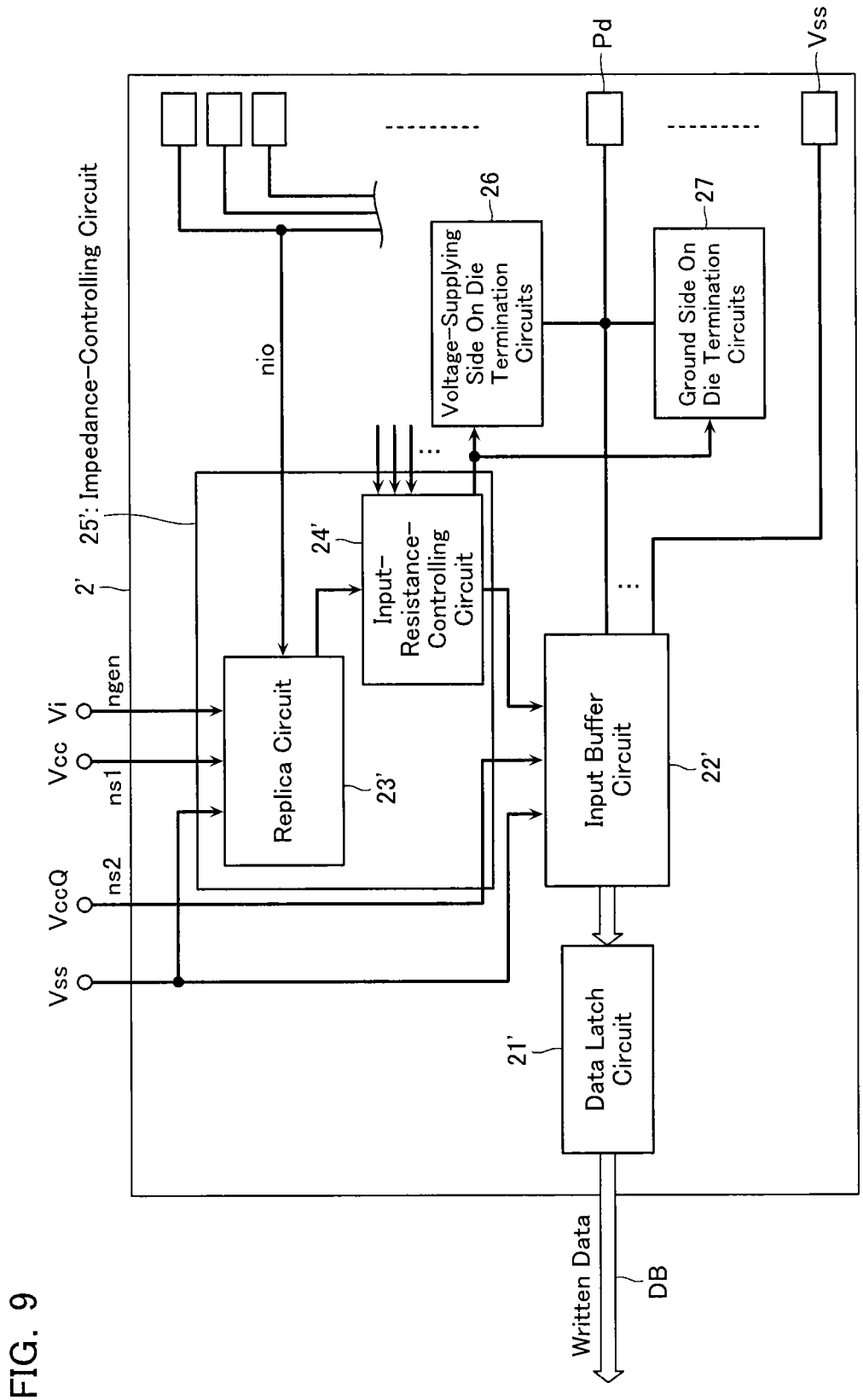
FIG. 9 is a block diagram showing a configuration of a data input/output buffer 2' according to a second embodiment.

FIG. 9 is a block diagram showing a configuration of the data input/output buffer 2' according to the embodiment. The data input/output buffer 2' comprises: an input buffer circuit 22' inputting data input via the data input/output pad Pd into the semiconductor memory device; and a data latch circuit 21' latching data output from the input buffer circuit 22' and outputting the data to the data bus DB. Additionally, voltage-supplying side on die termination circuits 26 and ground side on die termination circuits 27 controlling an input impedance are respectively connected to each of the data input/output nodes nio near the data input/output pad Pd. The voltage-supplying side on die termination circuits 26 and the ground side on die termination circuits 27 are controlled by an impedance controlling circuit 25'. The impedance controlling circuit 25' comprises: a replica circuit 23' which shows the same electric characteristics as the voltage-supplying side on die termination circuits 26 and the ground side on die termination circuits 27; and an input-resistance-controlling circuit 24' controlling the input-resistances of the voltage-supplying side on die termination circuits 26 and the ground side on die termination circuits 27 by inputting an input-resistance-data calculated by the replica circuit 23' to the voltage-supplying side on die termination circuits 26 and the ground side on die termination circuits 27.

Figure 10:
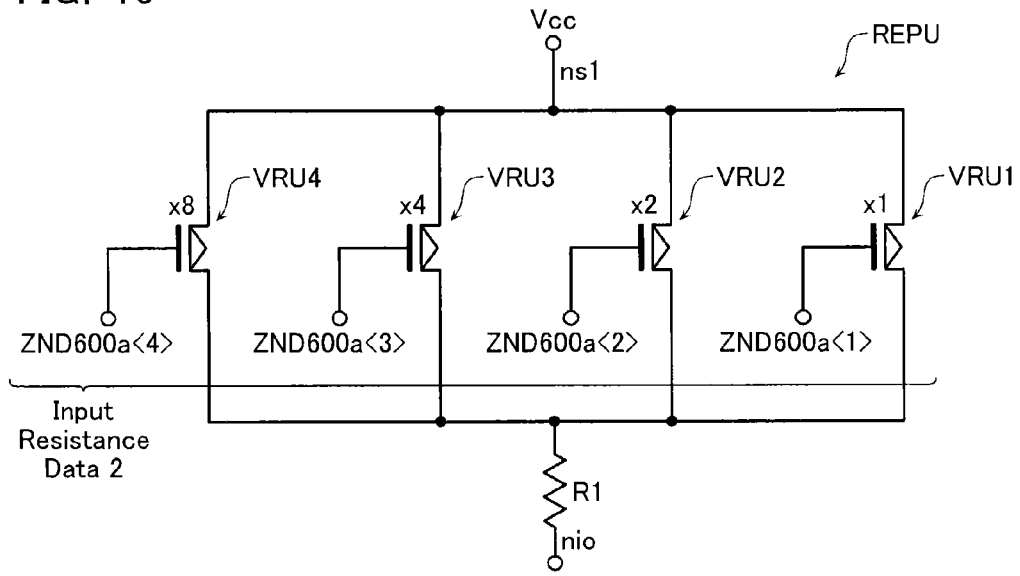
FIG. 10 is a circuit diagram showing a configuration of a voltage-supplying side replica circuit REPU according to the same embodiment.
Figure 11:
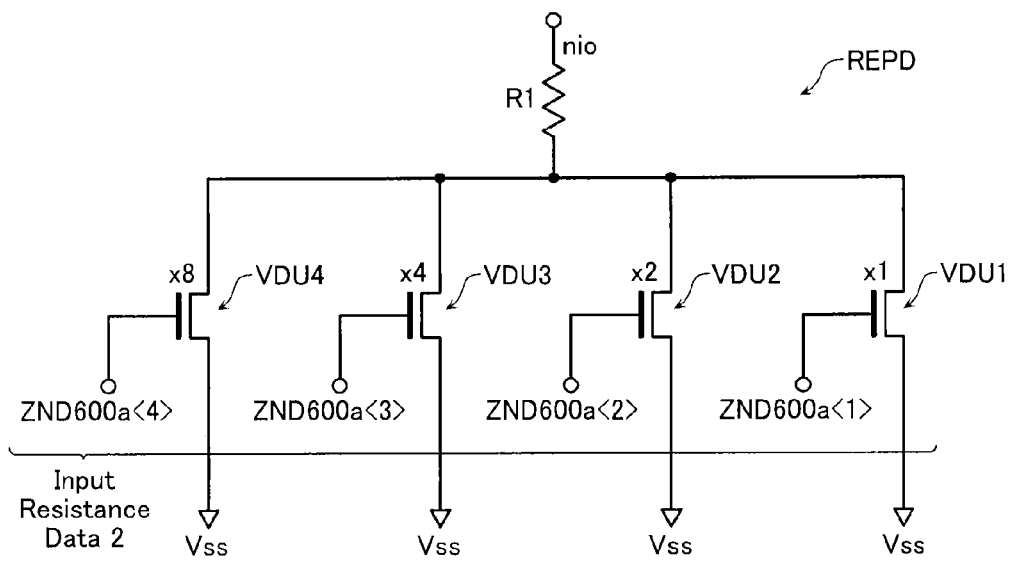
FIG. 11 is a circuit diagram showing a configuration of a ground side replica circuit REPD according to the same embodiment.

FIG. 10 and FIG. 11 are circuit diagrams showing a configuration of the replica circuit 23'. The replica circuit 23' comprises a voltage-supplying side replica circuit REPU and a ground side replica circuit REPD.

As shown in FIG. 10, the voltage-supplying side replica circuit REPU has a series circuit composed of a plurality of variable-resistance units VRU1 to VRUn connected in parallel and a resistance element R1. The series circuit is connected to the second-supplied-voltage-supplying node ns2 and the data input/output node nio. The plurality of the variable-resistance units VRU1 to VRUn respectively comprises one or a plurality of first P-channel transistors connected in parallel between the second-supplied-voltage-supplying node ns2 and the resistance element R1. The input resistance data 2 is n-bits binary data, and k-ordered data of the input resistance data is commonly input to gate terminals of the $2^{k-1}$ first P-channel transistors composing the k-ordered variable-resistance unit VRUk. Additionally, channel width, channel length and so on of the first P-channel transistors included by the voltage-supplying side replica circuit REPU are set to be the same as each other. Therefore, the voltage-supplying side replica circuit REPU is able to set a pull-up resistance between the second-supplied-voltage-supplying node ns2 and the data input/output node nio to certain resistance value selected from $2^n$ resistance values according to the input resistance data.

As shown in FIG. 11, the ground side replica circuit REPD has a series circuit composed of a resistance element R1 and a plurality of variable-resistance units VDU1 to VDUn connected in parallel. The series circuit is connected to the data input/output node nio and the ground terminal Vss. The plurality of the variable-resistance units VDU1 to VDUn respectively comprises one or a plurality of first N-channel transistors connected in parallel to the resistance element R1 and the ground terminal. The input resistance data output from the testing device 7 is n-bits binary data, and k-ordered data of the input resistance data is commonly input to gate terminals of the $2^{k-1}$ first N-channel transistors composing the k-ordered variable-resistance unit VRUk. Additionally, channel width, channel length and so on of the first N-channel transistors included by the ground side replica circuit REPD is set to be the same as each other. Therefore, the ground side replica circuit REPD is able to set a pull-down resistance between the data input/output node nio and the ground terminal Vss to certain resistance value selected from $2^n$ resistance values according to the input resistance data.

Similar to the first embodiment, the replica circuit 23' comprises a P-gate voltage controlling circuit PGC controlling the voltage-supplying side replica circuit REPU and an N-gate voltage controlling circuit NGC controlling the ground side replica circuit REPD.

Figure 12:
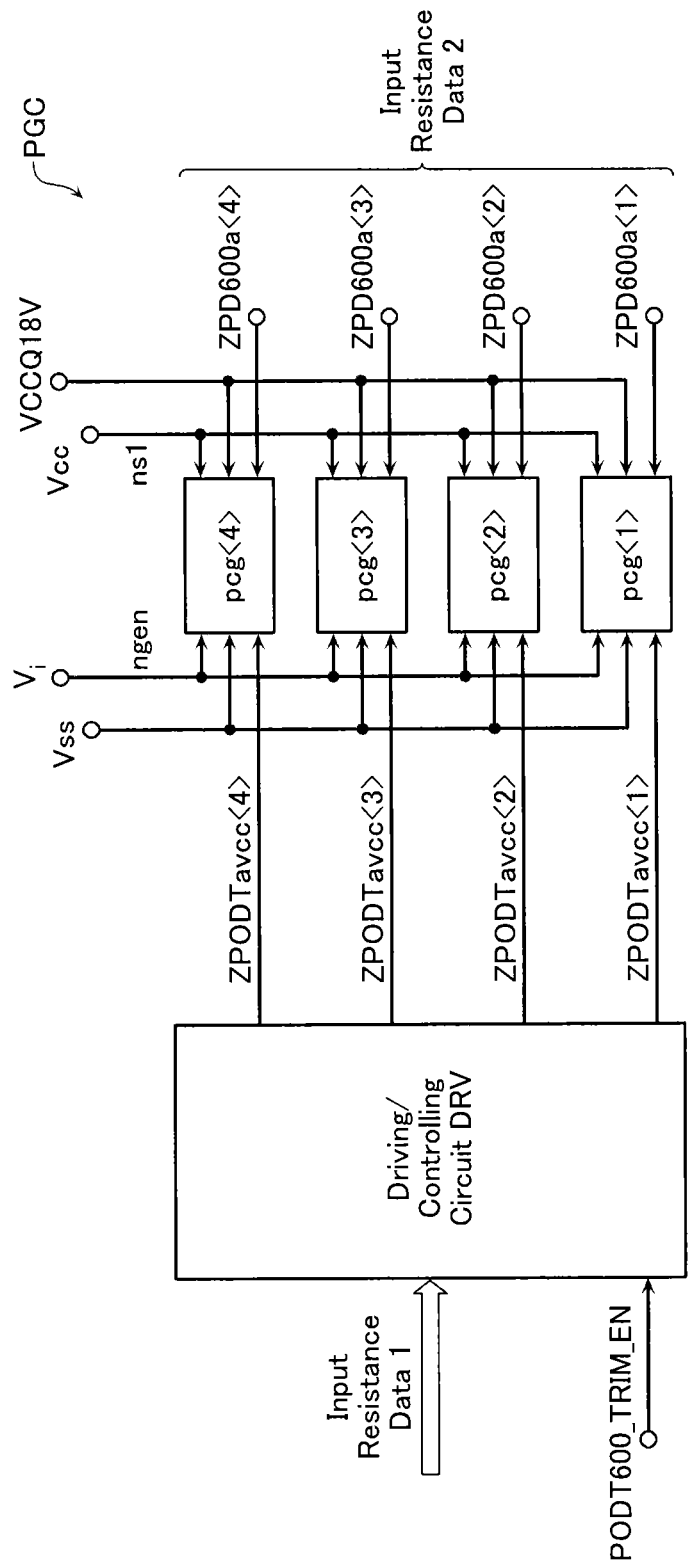
FIG. 12 is a circuit diagram showing a configuration of a P gate voltage controlling circuit PCG according to the same embodiment.
Figure 13:
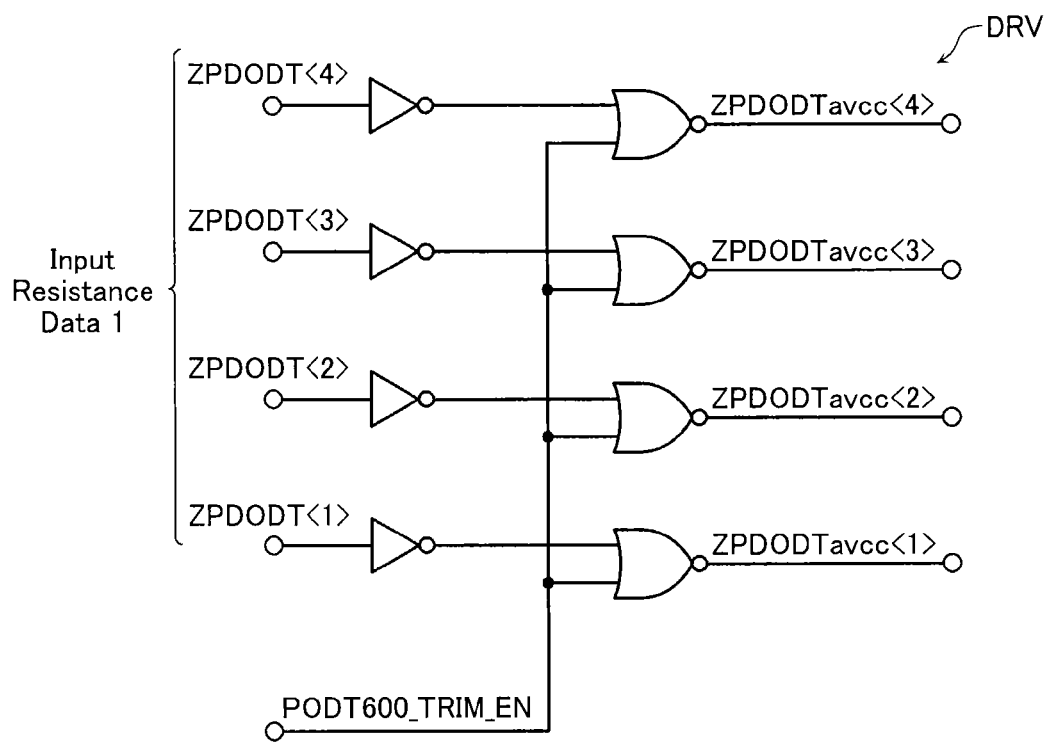
FIG. 13 is a circuit diagram showing a configuration of a driving/controlling circuit DRV according to the same embodiment.

As shown in FIG. 12, the P gate voltage controlling circuit PGC comprises a driving/controlling circuit DRV and P-gate voltage controlling circuit elements pcg<1> to pcg<n>. As shown in FIG. 13, the driving/controlling circuit DRV inputs an inner controlling signal PODT600_TRIM_EN. The inner controlling signal PODT600_TRIM_EN is set to be "L" state when a trimming operation of the voltage-supplying side replica circuit REPU is performed and is set to be "H" state when the trimming operation of the voltage-supplying side replica circuit REPU is not performed. Additionally, the driving/controlling circuit DRV inputs an input resistance data 1 and outputs each of a first-bit data of the input resistance data ZPDODTavcc<1> to an nth-bit data of the input resistance data ZPDODTavcc<n> to the P-gate voltage controlling circuit elements pcg<1> to pcg<n> according to the inner controlling signal PODT600_TRIM_EN.

Figure 14:
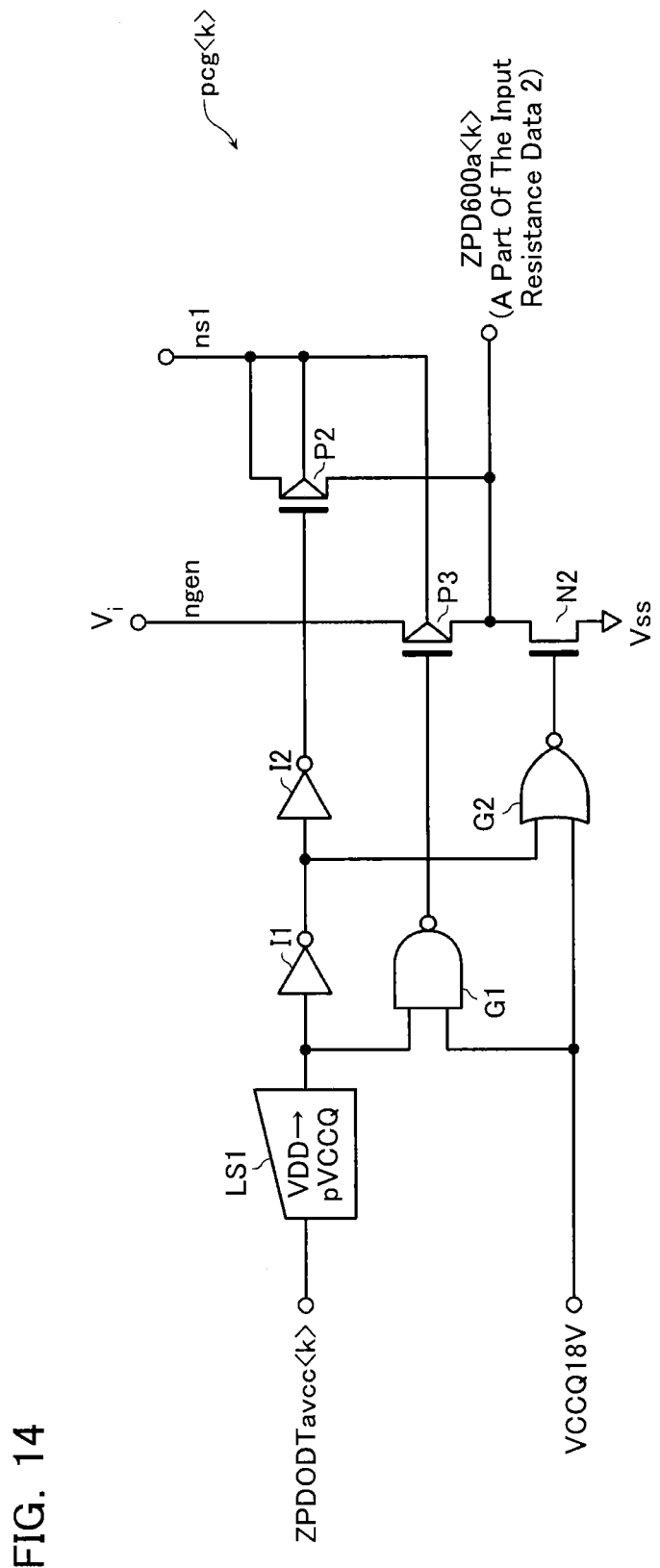
FIG. 14 is a circuit diagram showing a configuration of a P gate voltage controlling circuit element pcg<k> according to the same embodiment.

As shown in FIG. 14, the P-gate voltage controlling circuit elements pcg<k> inputs not only a kth-bit data of the input resistance data ZPDODTavcc<k>, but also the inner controlling signal VCCQ18V from the state machine 5. Similarly to the first embodiment, the inner controlling signal VCCQ18V is set to "L" state when the trimming operation is performed using the first voltage V1 as the second supplied voltage VccQ and is set to "H" state when the trimming operation is performed using the second voltage V2 as the second supplied voltage VccQ.

Figure 3:
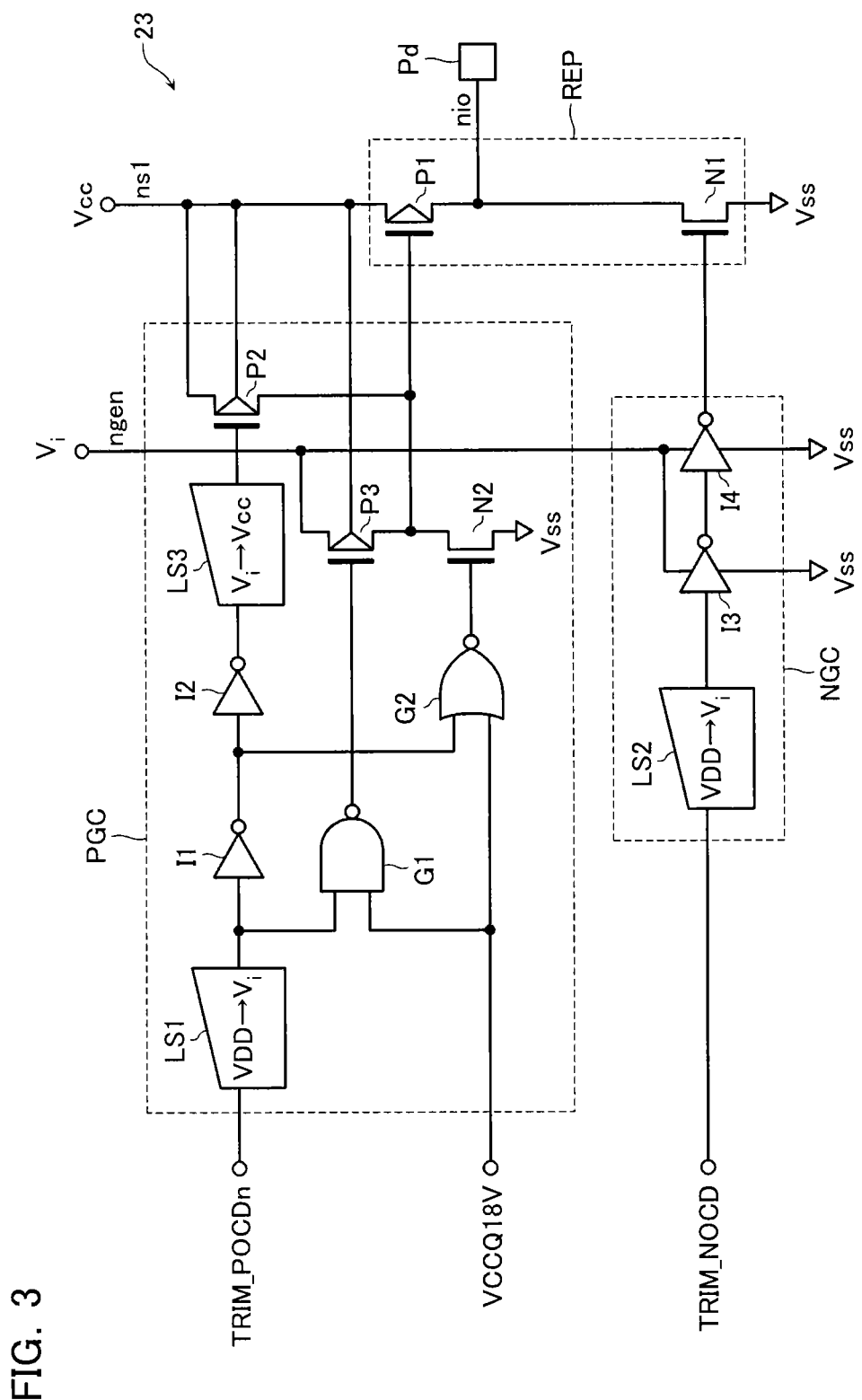
FIG. 3 is a circuit diagram showing a configuration of a replica circuit 23 of the semiconductor memory device according to the same embodiment.

The P-gate voltage controlling circuit element pcg<k> is composed similarly to the P-gate voltage controlling circuit PCG shown in FIG. 3. The P-gate voltage controlling circuit element pcg<k> comprises a second P-channel transistor P2, a third P-channel transistor P3 and a second N-channel transistor N3. The second P-channel transistor P2, the third P-channel transistor and the second N-channel transistor N2 according to the embodiment operate similarly to the second P-channel transistor P2, the third P-channel transistor P3 and the second N-channel transistor N2 according to the first embodiment.

Figure 15:
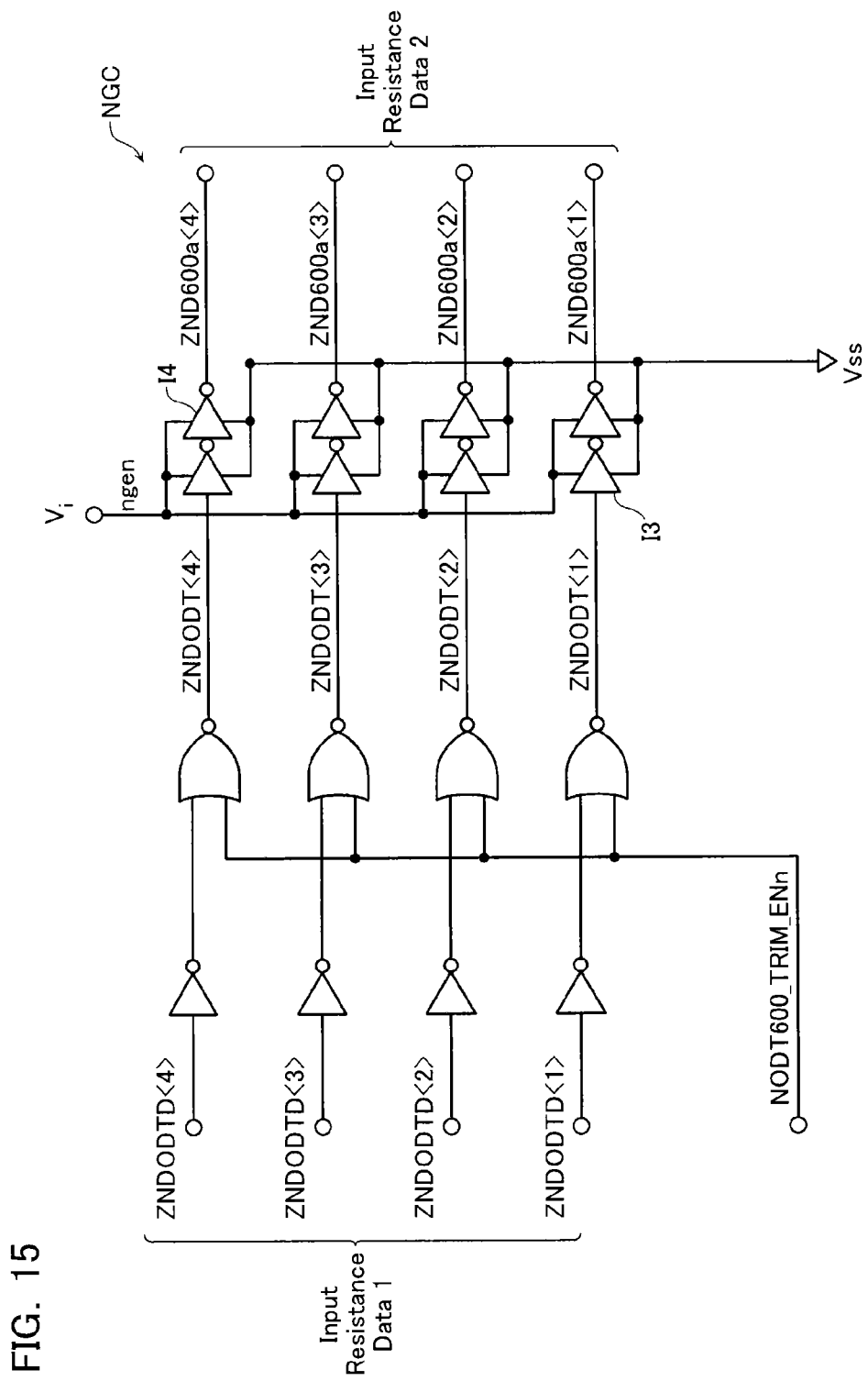
FIG. 15 is a circuit diagram showing a configuration of a N gate voltage controlling circuit NGC according to the same embodiment.

As shown in FIG. 15, the N gate voltage controlling circuit NGC inputs an inner controlling signal NODT600_TRIM_ENn from the state machine 5. The inner controlling signal NODT600_TRIM_ENn is set to "L" state when a trimming operation of the ground side replica circuit REPD is performed and set to "H" state when the trimming operation of the ground side replica circuit REPD is not performed. Additionally, the N gate voltage controlling circuit NGC inputs an input resistance data 1 and outputs an input resistance data 2 according to the inner controlling signal NODT600_TRIM_ENn. The input resistance data 1 and the input resistance data 2 are digital data showing the same current value and have different amplitudes from each other. In the input resistance data 2, a voltage of certain bits set to be "L" state is set to the ground voltage Vss and a voltage of certain bits set to be "H" state is set to the inner voltage $V_i$.

Third Embodiment

Next, a semiconductor memory device according to a third embodiment is described. The semiconductor memory device according to the third embodiment is composed basically the same as the semiconductor memory device according to the second embodiment. However, in the semiconductor memory device according to the embodiment, a structure of the impedance controlling circuit 25' is partly different from the structure of the impedance controlling circuit 25. The structural difference makes it possible to decrease monitoring current in the replica circuit 23' and power consumption of the trimming operation.

Figure 16:
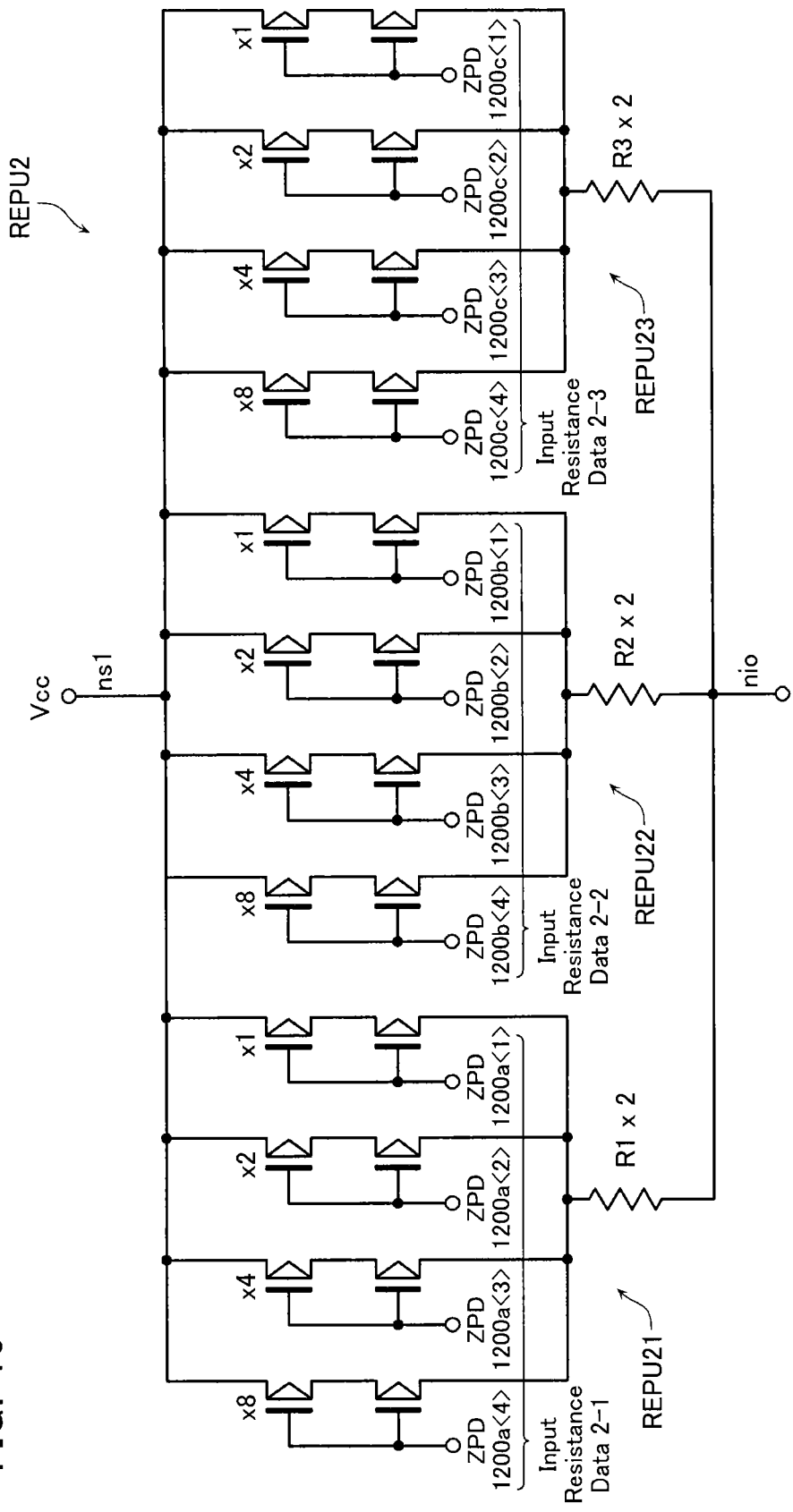
FIG. 16 is a circuit diagram showing a configuration of a voltage-supplying side replica circuit REPU2 according to a third embodiment.

FIG. 16 is a circuit diagram showing a structure of a voltage-supplying side replica circuit REPU2 according to the embodiment. The voltage-supplying side replica circuit REPU2 according to the embodiment comprises a plurality of voltage-supplying side replica circuit elements REPU21, a plurality of voltage-supplying side replica circuit elements REPU22 and a plurality of voltage-supplying side replica circuit elements REPU23 connected in parallel between the second-supplied-voltage-supplying node ns2 and the data input/output node nio. The voltage-supplying side replica circuit elements REPU21 is composed similarly to the replica circuit REPU according to the second embodiment (FIG. 10). Nevertheless, the voltage-supplying side replica circuit elements REPU21 according to the embodiment respectively have two resistive elements R1 connected serially and have two P-channel transistors P1 connected serially. Accordingly, a resistance value of the voltage-supplying side replica circuit elements REPU21 is twice as that of the voltage-supplying side replica circuit element REPU according to the second embodiment. Structures of the voltage-supplying side replica circuit element REPU22 and the voltage-supplying side replica circuit element REPU23 are almost the same as the structure of the voltage-supplying side replica circuit element REPU21. However, the voltage-supplying side replica circuit element REPU22 and the voltage-supplying side replica circuit element REPU23 respectively have a resistive element R2 and a resistive element R3 instead of the resistive element R1. Additionally, an input resistance data 2-1 is commonly input to gate terminals of the P-channel transistors composing the voltage-supplying side replica circuit element REPU21. Similarly, an input resistance data 2-2 is commonly input to gate terminals of the P-channel transistors composing the voltage-supplying side replica circuit element REPU22. Furthermore, an input resistance data 2-3 is commonly input to gate terminals of the P-channel transistors composing the voltage-supplying side replica circuit element REPU23. The input resistance data 2-1, the input resistance data 2-2 and the input resistance data 2-3 show the same current value and amplitudes of them are the same. The input resistance data 2-2 and the input resistance data 2-3 are respectively activated according to inner controlling signals sent from the state machine 5. If the input resistance data 2-2 is not activated, gate terminals of the P-channel transistors composing the voltage-supplying side replica circuit element REPU22 become "H" state. Therefore, the whole voltage-supplying side replica circuit element REPU22 becomes "OFF" state. Similarly, when the input resistance data 2-3 is not activated, the whole voltage-supplying side replica circuit element REPU23 becomes "OFF" state.

Figure 17:
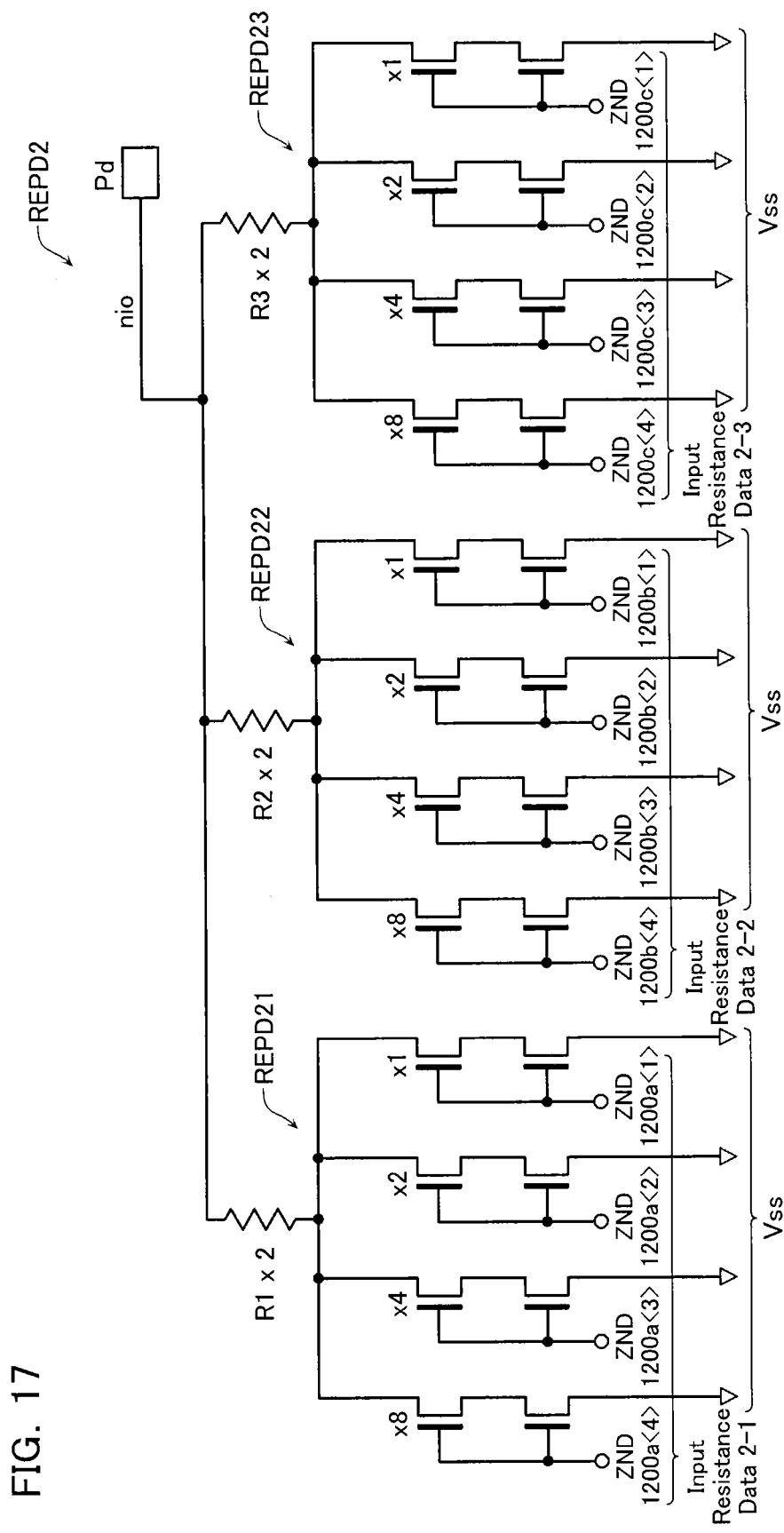
FIG. 17 is a circuit diagram showing a configuration of a ground side replica circuit REPD2 according to the same embodiment.

FIG. 17 is a circuit diagram showing a structure of a ground side replica circuit REPD2 according to the embodiment. The ground side replica circuit REPD2 comprises a ground side replica circuit element REPD21, a ground side replica circuit element REPD22 and a ground side replica circuit element REPD23 connected in parallel to the data input/output node nio and the ground terminal Vss. The ground side replica circuit element REPD21 is composed similarly to the replica circuit REPD according to the second embodiment (FIG. 11). However, the ground side replica circuit element REPD21 according to the embodiment has two resistance elements R1 connected serially and has two N-channel transistors N1 connected serially. Accordingly, a resistance value of the ground side replica circuit element REPD21 is twice as the ground side replica circuit element REPD according to the second embodiment. Structures of the ground side replica circuit element REPD22 and the ground side replica circuit element REPD23 are almost the same as the structure of the ground side replica circuit element REPD21. However, the ground side replica circuit element REPD22 and the ground side replica circuit element REPD23 respectively have a resistive element R2 and a resistive element R3 instead of the resistive element R1. Additionally, an input resistance data 2-1, an input resistance data 2-2 and an input resistance data 2-3 are respectively input to gate terminals of the N-channel transistors composing the ground side replica circuit element REPD21, the ground side replica circuit element REPD22 and the ground side replica circuit element REPD23. The input resistance data 2-1, the input resistance data 2-2 and the input resistance data 2-3 show the same current value and amplitudes of them are the same. The input resistance data 2-2 and the input resistance data 2-3 are respectively activated according to inner controlling signals sent from the state machine 5. When the input resistance data 2-2 is not activated, gate terminals of the N-channel transistors composing the ground side replica circuit element REPD22 become "L" state and the whole ground side replica circuit element REPD22 becomes "OFF" state. Similarly, when the input resistance data 2-3 is not activated, the ground side replica circuit element REPD23 becomes "OFF" state.

Figure 18:
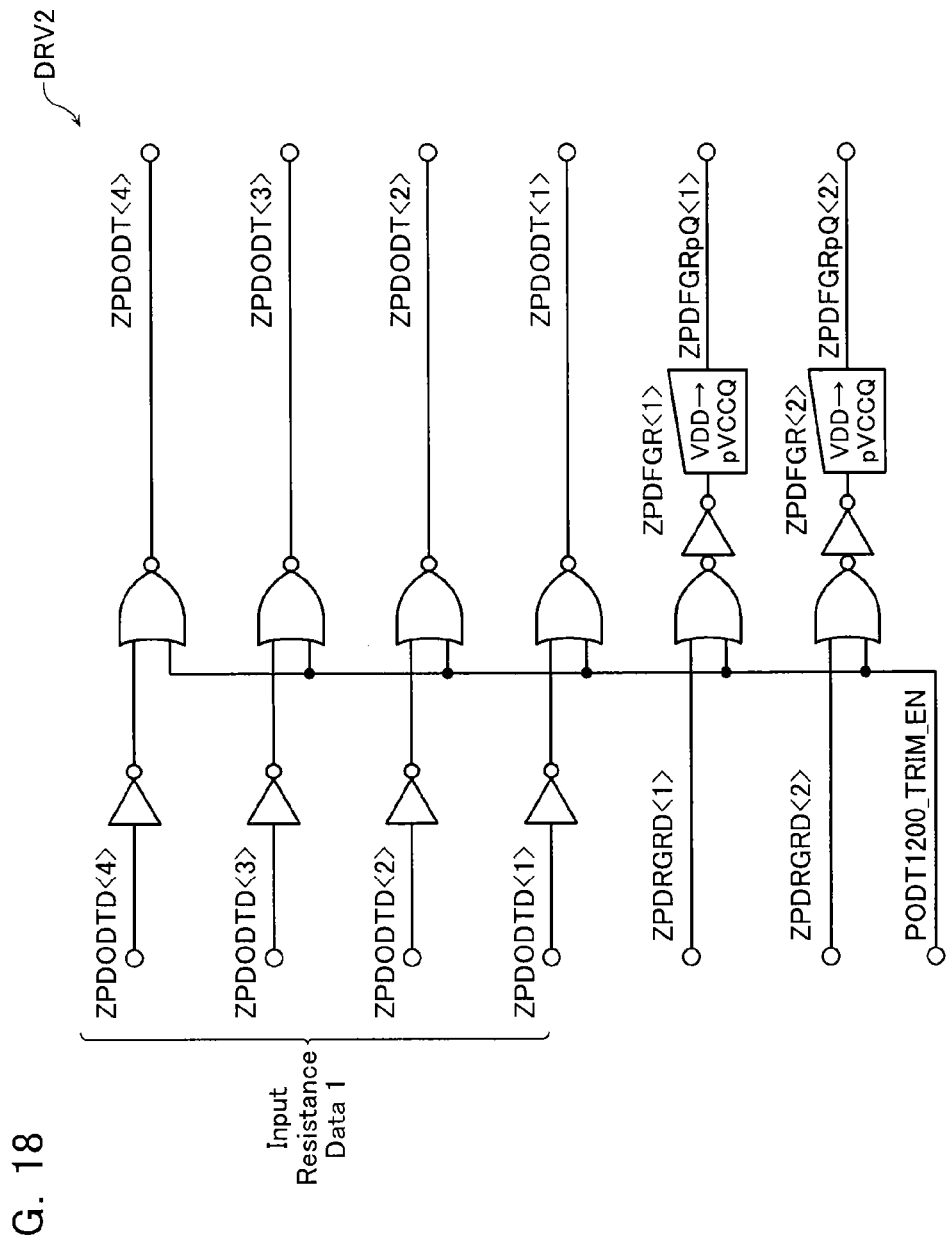
FIG. 18 is a circuit diagram showing a configuration of a driving/controlling circuit DRV2 according to the same embodiment.

As shown in FIG. 18, although a driving/controlling circuit DRV2 according to the embodiment is composed similarly to the driving/controlling circuit DRV according to the second embodiment, the driving/controlling circuit DRV2 inputs not only an inner controlling signal PODT1200_TRIM_EN, but also an inner controlling signal ZPDFGRD<1> and an inner controlling signal ZPDFGRD<2>. The inner controlling signal ZPDFGRD<1> is set to "L" state when the voltage-supplying side replica circuit element REPD22 is used and set to "H" state when the voltage-supplying side replica circuit element REPU22 is not used. Similarly, the inner controlling signal ZPDFGRD<2> is set to "L" state when the ground side replica circuit element REPD23 is used and is set to "H" state when the ground side replica circuit element REPD23 is not used. The driving/controlling circuit DRV2 according to the embodiment outputs the inner controlling signal ZPDF-GRD<1> as a signal ZPDFGRpQ<1> and inner controlling signal ZPDFGRD<2> as a signal ZPDFGRpQ<2> when a trimming operation of the voltage-supplying side replica circuit REPU2 is performed, that is, when the inner controlling signal PODT1200_TRIM_EN is "H" state.

Figure 19:
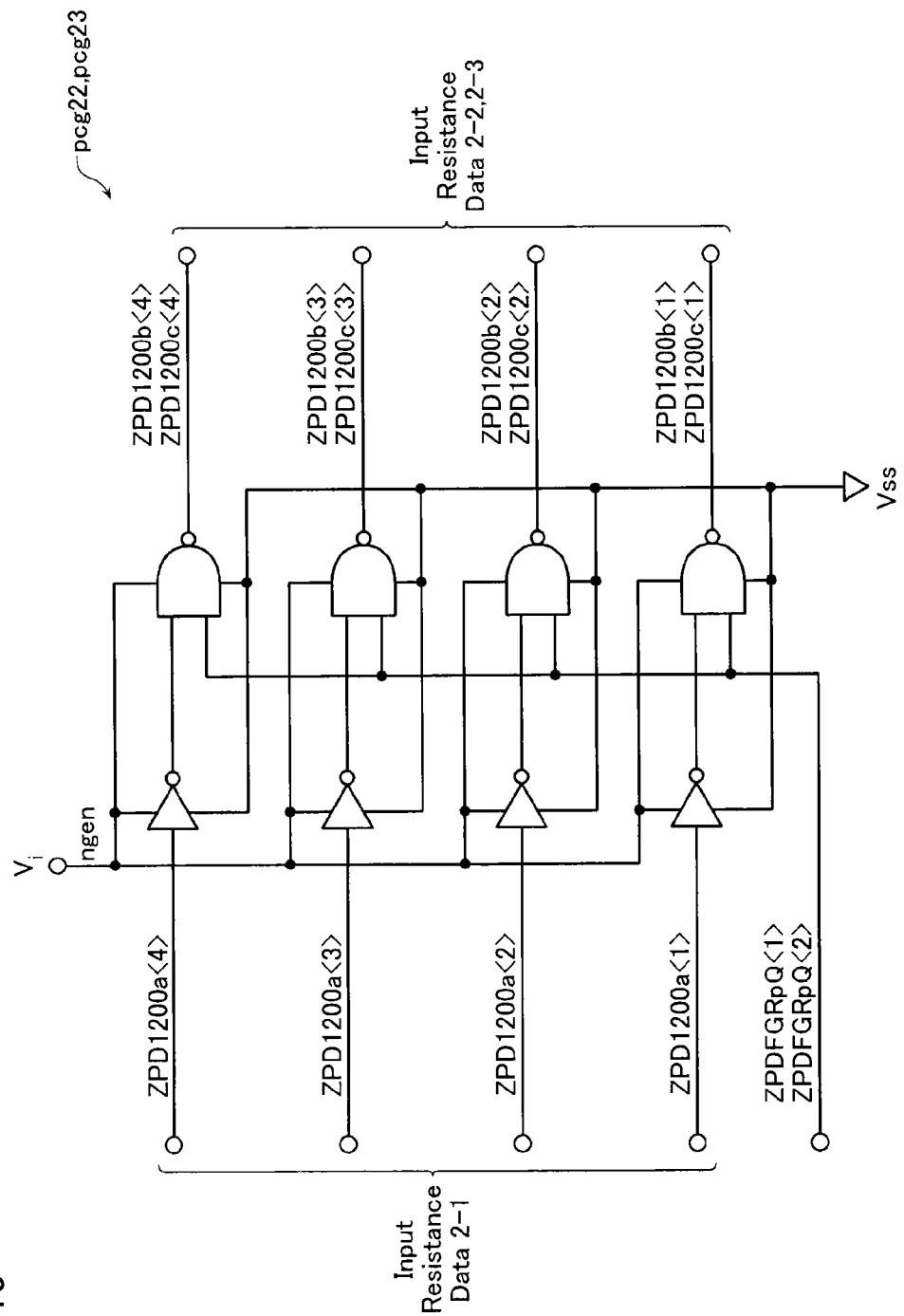
FIG. 19 is a circuit diagram showing a configuration of P gate voltage controlling circuit elements pcg22 and pcg23 according to the same embodiment.

A P gate voltage controlling circuit PGC according to this embodiment comprises: a plurality of P gate voltage controlling circuit elements pcg<1>-pcg<n> composed similarly to the P gate voltage controlling circuit element pcg<k> according to the second embodiment; and P gate voltage controlling circuit elements pcg22 and pcg23 shown in FIG. 19. In this embodiment, the P gate voltage controlling circuit elements pcg<1>-pcg<n> input inner controlling signals ZPDODT<1>-ZPDODT<n> instead of the inner controlling signals ZPDODTavcc<1>-ZPDODTavcc<n>. Furthermore, the P gate voltage controlling circuit elements pcg<1>-pcg<n> output ZPD1200a<1>-ZPD1200a<n> composing the input resistance data 2-1. As shown in FIG. 19, P gate voltage controlling circuit element pcg22 inputs the input resistance data 2-1 and outputs input resistance data 2-2 according to the inner controlling signal ZPDFGRpQ<1>. The P gate voltage controlling circuit element pcg23 is composed similarly to the P gate voltage controlling circuit element pcg22 and outputs the input resistance data 2-3 according to the inner controlling signal ZPDFGRpQ<2>.

An N gate voltage controlling circuit NGC according to the embodiment comprises: an N gate voltage controlling circuit element ngc21 outputting the inner resistance data 2-1 to the ground side replica circuit element REPD21; an N gate voltage controlling circuit element ngc22 outputting the input resistance data 2-2 to the ground side replica circuit element REPD22; and an N gate voltage controlling circuit element ngc23 outputting the input resistance data 2-3 to the ground side replica circuit element REPD23.

Figure 20:
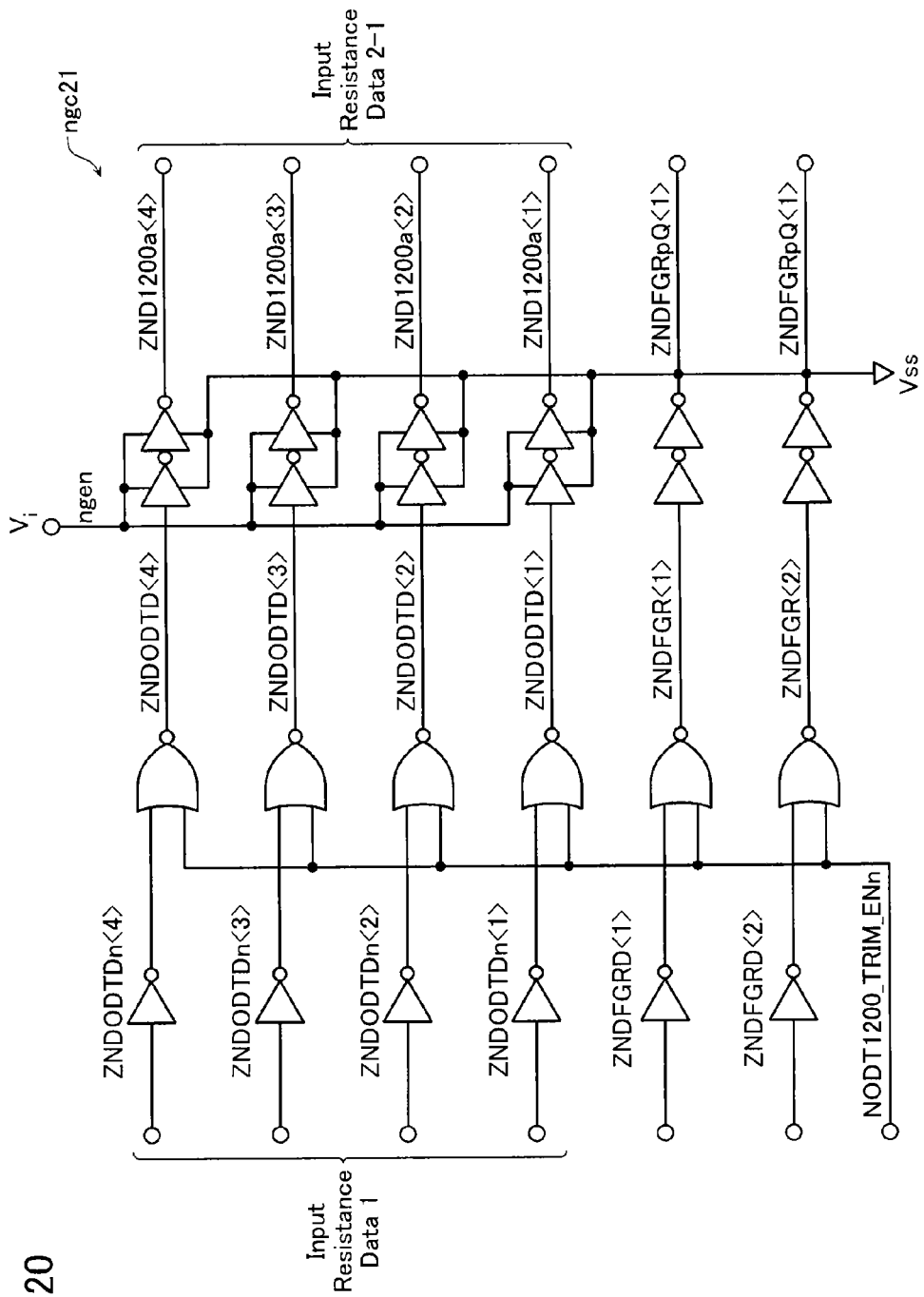
FIG. 20 is a circuit diagram showing a configuration of a N gate voltage controlling circuit element ncg21 according to the same embodiment.

As shown in FIG. 20, the N gate voltage controlling circuit element ngc21 is basically composed similarly to the N gate voltage controlling circuit NGC according to the second embodiment. However, the N gate voltage controlling circuit element ngc21 inputs not only the inner controlling signal NODT1200_TRIM_ENn, but also an inner controlling signal ZNDFGRD<1> and an inner controlling signal ZNDF-GRD<2> sent from the state machine 5. The inner controlling signal ZNDFGRD<1> is set to "H" state when the ground side replica circuit REPD22 is used and set to "L" state when the ground side replica circuit element REPD22 is not used. Similarly, the inner controlling signal ZNDF-GRD<2> is set to "H" state when the ground side replica circuit element REPD23 is used and set to "L" state when the ground side replica circuit element REPD23 is not used. The N gate voltage controlling circuit element ngc21 according to the embodiment outputs the inner controlling signal ZNDF-GRD<1> as the inner controlling signal ZNDFGRpQ<1> and outputs the inner controlling signal ZNDFGRD<2> as the inner controlling signal ZNDFGRpQ<2> when the trimming operation of the ground side replica circuit REPD2 is performed, that is, the inner controlling signal NODT1200_TRIM_ENn is set to "L" state.

Figure 21:
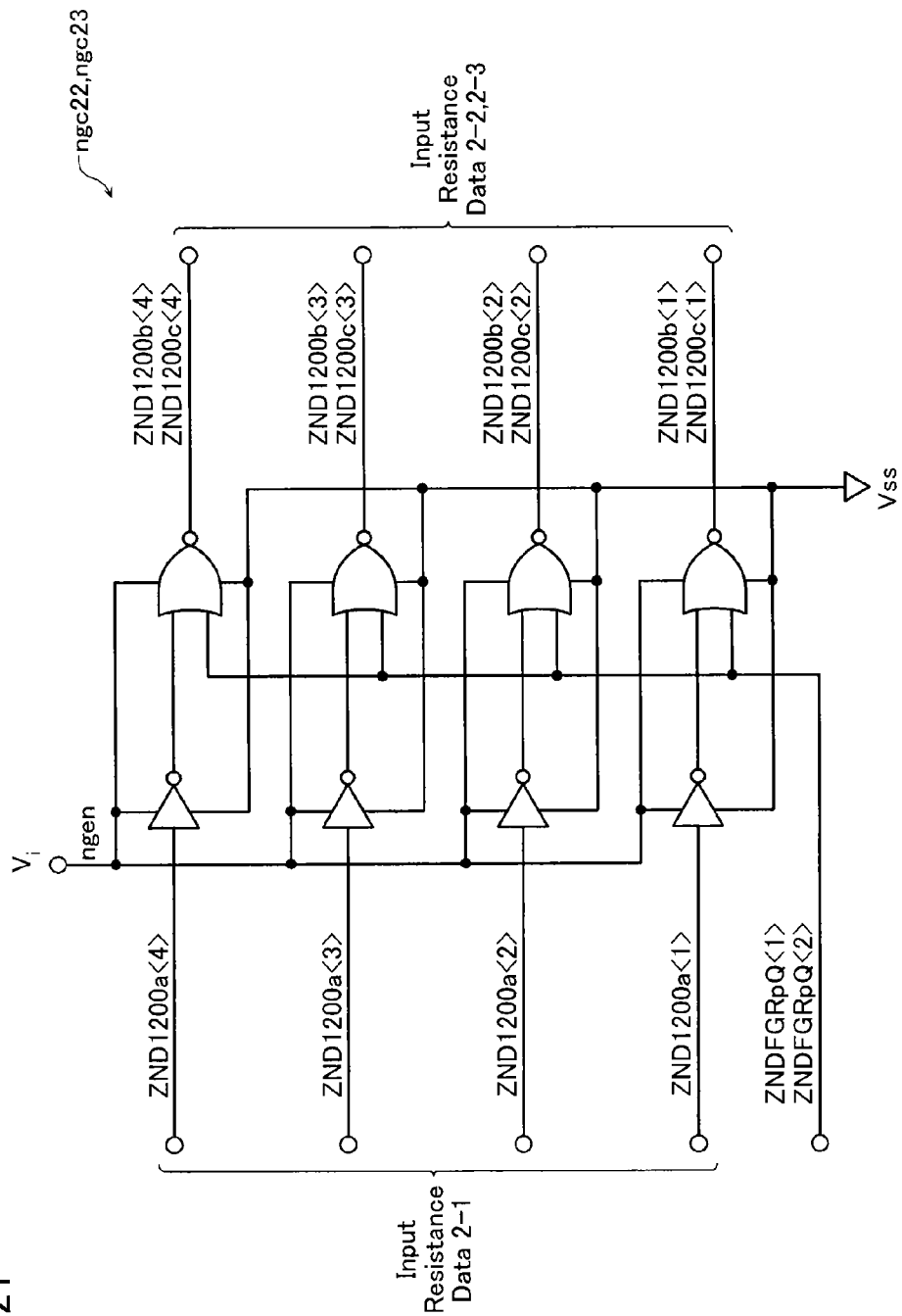
FIG. 21 is a circuit diagram showing a configuration of N gate voltage controlling circuit elements ncg22 and ncg23 according to the same embodiment.

Additionally, the N gate voltage controlling circuit element ngc21 is connected to the N gate voltage controlling circuit element ngc22 and the N gate voltage controlling circuit element ngc23 and outputs the input resistance data 2-1 to the N gate voltage controlling circuit element ngc22 and the N gate voltage controlling circuit element ngc23. As shown in FIG. 21, the N gate voltage controlling circuit element ngc22 inputs the input resistance data 2-1 and outputs the input resistance data 2-2 according to the inner controlling signal ZNDFGRpQ<1>. The N gate voltage controlling circuit element ngc23 is composed similarly to the N gate voltage controlling circuit element ngc22 and outputs the input resistance data 2-3 according to the inner controlling signal ZND-FGRpQ<2>.

Another Embodiment

Figure 22:
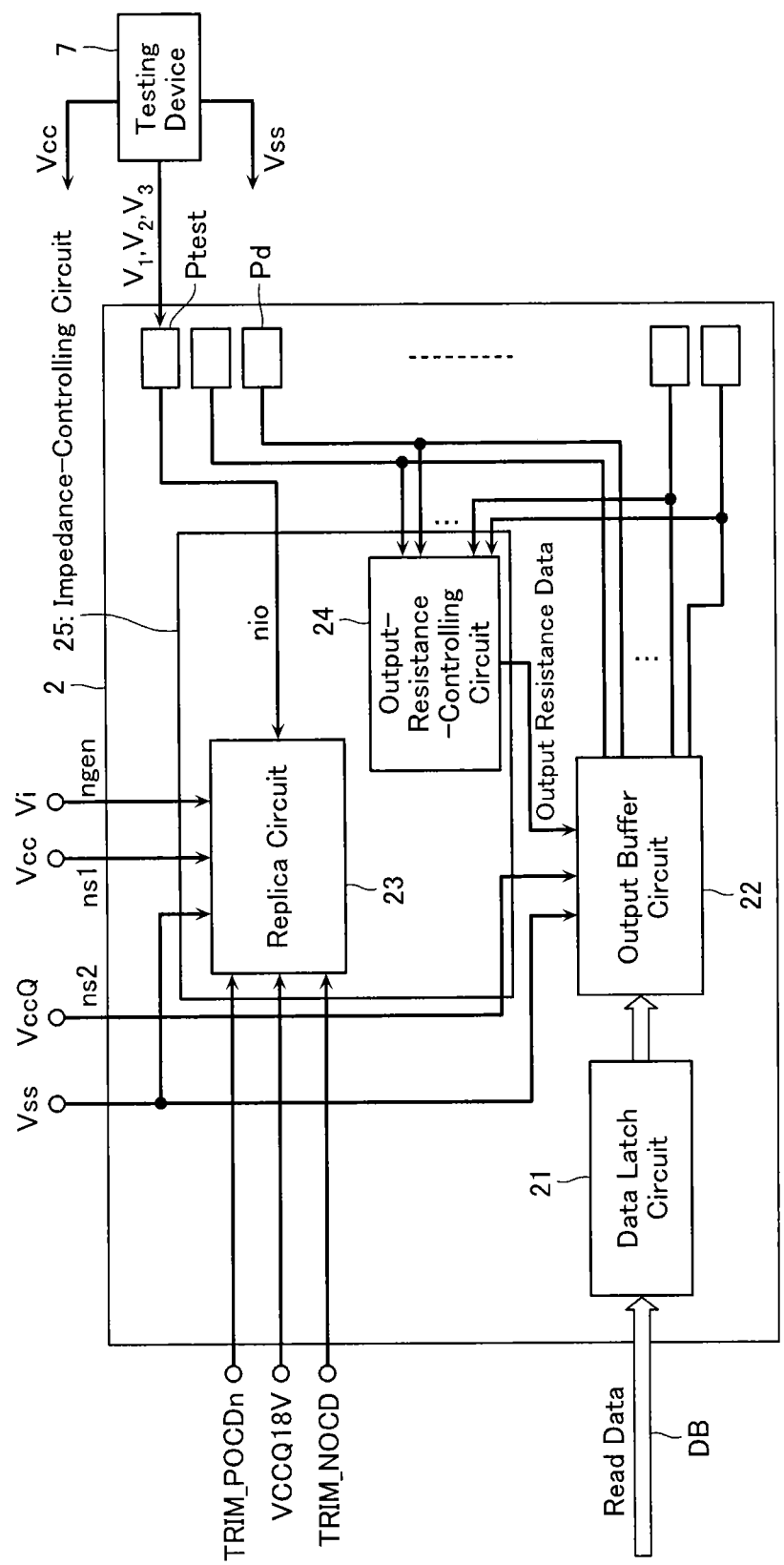
FIG. 22 is a block diagram showing a configuration of a data input/output buffer 2 according to another embodiment.

In the first embodiment, the data input/output pad Pd is used not only to receive the writing data and to output the read data, but also to perform the testing operation. However, the data input/output pad Pd used to perform the testing operation can be distinguished from the data input/output pad Pd used to receive the writing data and to output the read data. That is, an additional pad can be connected to the data input/output buffer 2 as a test pad as shown in FIG. 22. FIG. 22 is a block diagram showing a configuration of apart of the data input/output buffer 2 according to another embodiment.

The data input/output buffer 2 according to the embodiment is configured similarly to the data input/output buffer 2 according to the first embodiment. However, in this embodiment, the data input/output buffer 2 further includes a test pad Ptest connected to the replica circuit 23 and the input/output pad Pd is not connected to the replica circuit 23. Additionally, in this embodiment, the data input/output pad Pd is connected to the plurality of the pull-down transistors and the plurality of the pull-up transistors, and the test pad Ptest is connected to the drain terminal of the first P-channel transistor P1 and the drain terminal of the first N-channel transistor N1.

Figure 23:
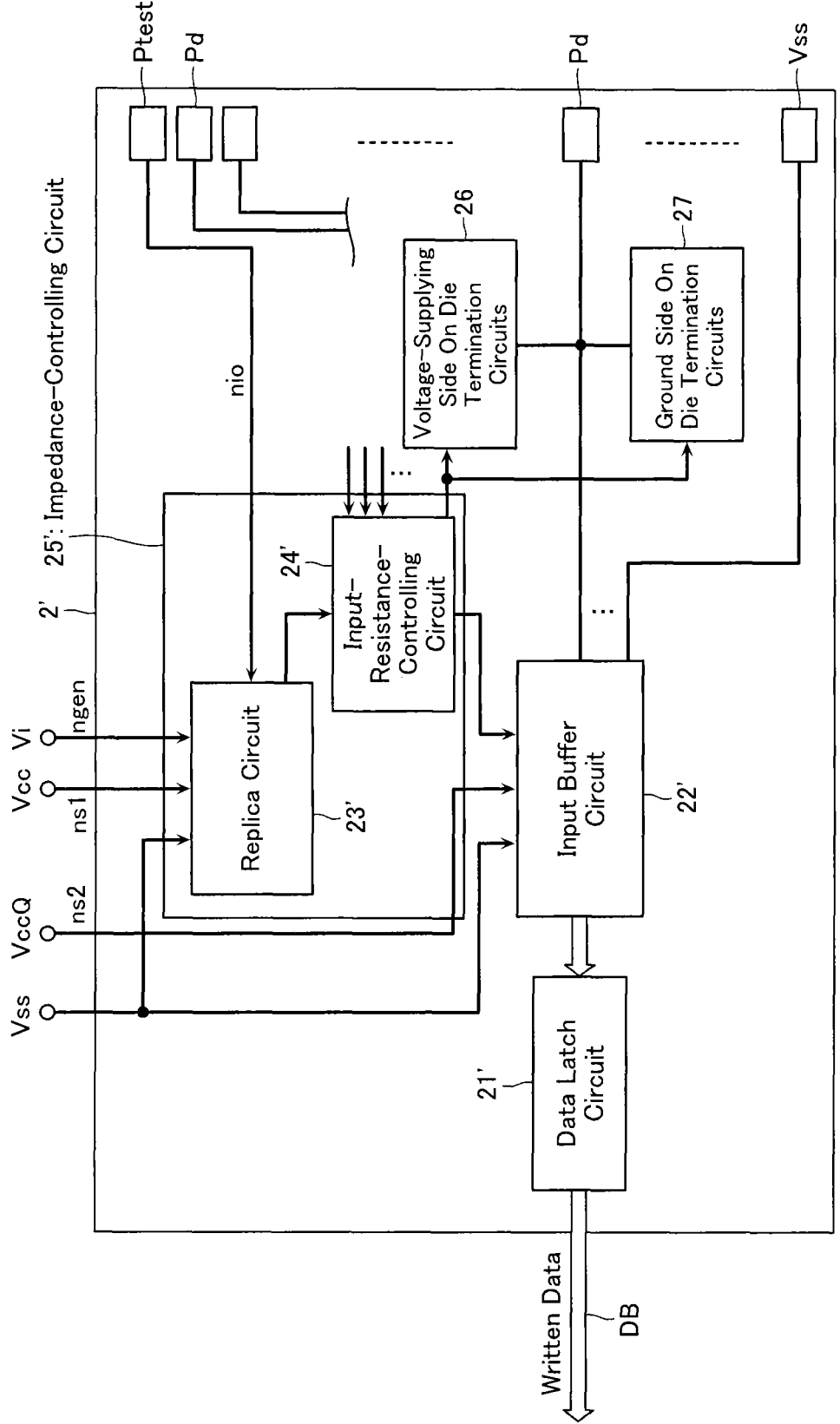
FIG. 23 is a block diagram showing a configuration of a data input/output buffer 2' according to another embodiment.

As shown in FIG. 23, it is also possible to use the test pad Ptest and the input/output pad Pd when data is input. FIG. 23 is a block diagram showing a configuration of the data input/output buffer 2' according to the embodiment.

The data input/output buffer 2' according to the embodiment is configured similarly to the data input/output buffer 2' according to the second embodiment. However, in this embodiment, the data input/output buffer 2' further includes a test pad Ptest connected to the replica circuit 23' and the input/output pad Pd is not connected to the replica circuit 23'. Additionally, in this embodiment, the data input/output pad Pd is connected to the plurality of the pull-down transistors and the plurality of the pull-up transistors, and the test pad Ptest is connected to the drain terminal of the first P-channel transistor P1 and the drain terminal of the first N-channel transistor N1.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a first pad to which a first supplied voltage is supplied;
a second pad to which a second supplied voltage is supplied;
a third pad;
a memory body to which the first supplied voltage is supplied and memorizing data;
a buffer circuit connected to the memory body and the third pad and to which the second supplied voltage is supplied; and
an impedance-controlling circuit controlling an impedance of the buffer circuit,
to which a first voltage is supplied as the first supplied voltage and to which one of the first voltage and a second voltage smaller than the first voltage is supplied as the second supplied voltage, wherein
the semiconductor memory device comprises a voltage-generating circuit generating a first inner voltage from the first supplied voltage supplied via the first pad,
as a replica element of transistors in a final stage of the buffer circuit, the impedance-controlling circuit comprises a first P-channel transistor at the final stage, and
a source terminal of the first P-channel transistor is connected to the first pad, and the first inner voltage generated from the voltage-generating circuit is selectively supplied to a gate terminal of the first P-channel transistor.

2. The semiconductor memory device according to claim 1, wherein
the impedance-controlling circuit further comprises a first N-channel transistor having a drain terminal connected to a drain terminal of the first P-channel transistor and a source terminal connected to a ground-voltage-supplying pad as a replica element of transistors in the final stage of the buffer circuit, and
the first inner voltage is selectively supplied to a gate terminal of the first N-channel transistor.

3. The semiconductor memory device according to claim 2, wherein
the buffer circuit is an output buffer circuit,
the output buffer circuit comprises a plurality of pull-up transistors connected in parallel between the second pad and a data input/output pad and a plurality of pull-down transistors connected in parallel between the data input/output pad and the ground-voltage-supplying pad,
the first P-channel transistor is a replica element of the pull-up transistors,
the first N-channel transistor is a replica element of the pull-down transistors, and
the impedance-controlling circuit comprises:
a replica circuit having the first P-channel transistor showing the same electrical characteristics as the pull-up transistors and the first N-channel transistor showing the same electrical characteristics as the pull-down transistors wherein the drain terminal of the first P-channel transistor and the drain terminal of the first N-channel transistor are connected to the third pad; and
an output-resistance-controlling circuit generating output resistance data controlling an output resistance of the output buffer circuit by controlling conducting states of the plurality of the pull-up transistors and the plurality of the pull-down transistors based on a current data.

4. The semiconductor memory device according to claim 3, wherein
the replica circuit further comprises:
a P gate voltage controlling circuit controlling a gate voltage of the first P-channel transistor according to a first inner controlling signal; and
an N gate voltage controlling circuit controlling a gate voltage of the first N-channel transistor according to a second inner controlling signal.

5. The semiconductor memory device according to claim 4, wherein
the P gate voltage controlling circuit comprises:
a second P-channel transistor having a drain terminal connected to the gate terminal of the first P-channel transistor and a source terminal connected to the first pad;
a third P-channel transistor having a drain terminal connected to the gate terminal of the first P-channel transistor and a source terminal connected to the voltage-generating circuit; and
a second N-channel transistor having a drain terminal connected to the gate terminal of the first P-channel transistor and a source terminal connected to the ground-voltage-supplying pad.

6. The semiconductor memory device according to claim 5, wherein a substrate terminal of the second P-channel transistor and a substrate terminal of the third P-channel transistor are connected to the first pad.

7. The semiconductor memory device according to claim 3, wherein the semiconductor memory device comprises the third pad as a test pad independently of the data input/output pad.

8. The semiconductor memory device according to claim 2, wherein
the buffer circuit is an input buffer circuit,
an on die termination circuit connected to the data input/output buffer is formed,
the on die termination circuit comprises a plurality of pull-up transistors connected in parallel between the second pad and a data input/output pad and a plurality of pull-down transistors connected in parallel between the data input/output pad and the ground-voltage-supplying pad,
the first P-channel transistor is a replica element of the pull-up transistors,
the first N-channel transistor is a replica element of the pull-down transistors, and
the impedance-controlling circuit comprises:
a replica circuit having the first P-channel transistor showing the same electrical characteristics as the pull-up transistors and the first N-channel transistor showing the same electrical characteristics as the pull-down transistors, wherein the drain terminal of the first P-channel transistor and the drain terminal of the first N-channel transistor are connected to the third pad; and
an input-resistance-controlling circuit controlling the input resistance of the on die termination circuit by outputting an input resistance data calculated by the replica circuit to the on die termination circuit.

9. The semiconductor memory device according to claim 8, wherein
the replica circuit further comprises:
a P gate voltage controlling circuit controlling a gate voltage of the first P-channel transistor according to a first inner controlling signal; and
an N gate voltage controlling circuit controlling a gate voltage of the first N-channel transistor according to a second inner controlling signal.

10. The semiconductor memory device according to claim 9, wherein
the P gate voltage controlling circuit comprises:
a second P-channel transistor having a drain terminal connected to the gate terminal of the first P-channel transistor and a source terminal connected to the first pad;
a third P-channel transistor having a drain terminal connected to the gate terminal of the first P-channel transistor and a source terminal connected to the voltage-generating circuit; and
a second N-channel transistor having a drain terminal connected to the gate terminal of the first P-channel transistor and a source terminal connected to the ground-voltage-supplying pad.

11. The semiconductor memory device according to claim 10, wherein a substrate terminal of the second P-channel transistor and a substrate terminal of the third P-channel transistor are connected to the first pad.

12. The semiconductor memory device according to claim 8, wherein the semiconductor memory device comprises the third pad as a test pad independently of the data input/output pad.

13. A semiconductor memory device, comprising:
a first pad to which a first supplied voltage is supplied;
a second pad to which a second supplied voltage is supplied;
a third pad;
a ground-voltage-supplying pad to which a ground voltage is supplied;
a memory body to which the first supplied voltage is supplied and memorizing data;
a buffer circuit connected to the memory body and the third pad and to which the second supplied voltage is supplied; and
an impedance-controlling circuit controlling an impedance of the buffer circuit,
to which a first voltage is supplied as the first supplied voltage and to which one of the first voltage and a second voltage smaller than the first voltage is supplied as the second supplied voltage, wherein
the semiconductor memory device further comprises a voltage-generating circuit generating a first inner voltage from the first supplied voltage supplied via the first pad,
the impedance-controlling circuit comprises:
a resistance circuit setting an input/output impedance of the buffer circuit;
a replica circuit including replica elements of the resistance circuit; and
a resistance-controlling circuit setting the input/output impedance of the resistance circuit by performing a trimming operation using the replica circuit,
the replica circuit comprises a first P-channel transistor connected between the first pad and the third pad and a first N-channel transistor connected between the third pad and the ground-voltage-supplying pad, and
the first inner voltage generated from the voltage-generating circuit is selectively supplied to at least one of a gate terminal of the first P-channel transistor and a gate terminal of the first N-channel transistor.

14. The semiconductor memory device according to claim 13, wherein
the buffer circuit is an output buffer circuit,
the output buffer circuit comprises a plurality of pull-up transistors connected in parallel between the second pad and the data input/output pad and a plurality of pull-down transistors connected in parallel between the data input/output pad and the ground-voltage supplying pad.

15. The semiconductor memory device according to claim 13, wherein
the replica circuit further comprises:
a P gate voltage controlling circuit controlling a gate voltage of the first P-channel transistor according to a first inner controlling signal; and
an N gate voltage controlling circuit controlling a gate voltage of the first N-channel transistor according to a second inner controlling signal.

16. The semiconductor memory device according to claim 15, wherein
the P gate voltage controlling circuit comprises:
a second P-channel transistor having a drain terminal connected to the gate terminal of the first P-channel transistor and a source terminal connected to the first pad;
a third P-channel transistor having a drain terminal connected to the gate terminal of the first P-channel transistor and a source terminal connected to the voltage-generating circuit; and
a second N-channel transistor having a drain terminal connected to the gate terminal of the first P-channel transistor and a source terminal connected to the ground-voltage-supplying pad.

17. A method of testing a semiconductor memory device using a testing device connected to the semiconductor memory device, wherein,
the semiconductor memory device comprises:
a first pad to which a first supplied voltage is supplied;
a second pad to which a second supplied voltage is supplied;
a third pad;
a memory body to which the first supplied voltage is supplied and memorizing data;
a buffer circuit connected to the memory body and the third pad and to which the second supplied voltage is supplied;
an impedance-controlling circuit controlling an impedance of the buffer circuit,
a voltage-generating circuit generating a first inner voltage from the first supplied voltage supplied via the first pad,
to which a first voltage is supplied as the first supplied voltage and to which one of the first voltage and a second voltage smaller than the first voltage is supplied as the second supplied voltage, and
as a replica element of transistors in a final stage of the buffer circuit, the impedance-controlling circuit comprises a first P-channel transistor at the final stage, wherein
the testing device supplies the first supplied voltage to the third pad connected to a source terminal of the first P-channel transistor, and
the voltage-generating circuit selectively supplies the inner voltage to a gate terminal of the first P-channel transistor.

18. The method of testing a semiconductor memory device according to claim 17, wherein
the impedance-controlling circuit further comprises a first N-channel transistor having a drain terminal connected to a drain terminal of the first P-channel transistor and a source terminal connected to a ground-voltage-supplying pad as a replica element of transistors in the final stage of the buffer circuit, and
the first inner voltage is selectively supplied to a gate terminal of the first N-channel transistor.

19. The method of testing a semiconductor memory device according to claim 18, wherein
when the first voltage is supplied as the second supplied voltage, and when a trimming of the first P-channel transistor is performed,
the testing device supplies a first voltage to the first pad, a half voltage of the first voltage to the third pad and ground voltage to the ground-voltage-supplying pad,
the impedance-controlling circuit supplies the ground voltage to the gate terminal of the first P-channel transistor and to the gate terminal of the first N-channel transistor, and
the testing device outputs to the semiconductor memory device a current data earned by measuring a current flowing through the third pad.

20. The method of testing a semiconductor memory device according to claim 18, wherein
when the second voltage is supplied as the second supplied voltage, and when a trimming of the first P-channel transistor is performed,
the testing device supplies a voltage twice as the second voltage to the first pad, one and a half voltage of the second voltage to the third pad and ground voltage to the ground-voltage-supplying pad,
the impedance-controlling circuit supplies the second voltage to the gate terminal of the first P-channel transistor and the ground voltage to the gate terminal of the first N-channel transistor, and
the testing device outputs to the semiconductor memory device a current data earned by measuring a current flowing through the third pad.

21. The method of testing a semiconductor memory device according to claim 18, wherein
when a trimming of the first N-channel transistor is performed,
the testing device supplies a first voltage to the first pad, a half voltage of the inner voltage to the third pad and ground voltage to the ground-voltage-supplying pad,
the impedance-controlling circuit supplies the first voltage to the gate terminal of the first P-channel transistor and the inner voltage to the gate terminal of the first N-channel transistor, and
the testing device outputs to the semiconductor memory device a current data earned by measuring a current flowing through the third pad.

22. The method of testing a semiconductor memory device according to claim 21, wherein the inner voltage is the first voltage or the second voltage.

* * * * *